(12) United States Patent
Wood et al.

(10) Patent No.: US 7,425,407 B1
(45) Date of Patent: *Sep. 16, 2008

(54) METHODS FOR FABRICATING OPTICAL MICROSTRUCTURES BY IMAGING A RADIATION SENSITIVE LAYER SANDWICHED BETWEEN OUTER LAYERS

(75) Inventors: Robert L. Wood, Apex, NC (US); Thomas A. Rinehart, Durham, NC (US); Robert P. Freese, Chapel Hill, NC (US)

(73) Assignee: Bright View Technologies, Inc., Morrisville, NC (US)

( * ) Notice: Subject to any disclaimer, the term of this patent is extended or adjusted under 35 U.S.C. 154(b) by 128 days.

This patent is subject to a terminal disclaimer.

(21) Appl. No.: 11/465,358

(22) Filed: Aug. 17, 2006

Related U.S. Application Data

(63) Continuation of application No. 10/661,974, filed on Sep. 11, 2003, now Pat. No. 7,192,692.

(51) Int. Cl.
*G03F 7/00* (2006.01)
*G02B 3/00* (2006.01)
(52) U.S. Cl. ..................... 430/321; 430/945
(58) Field of Classification Search ............... None
See application file for complete search history.

(56) References Cited

U.S. PATENT DOCUMENTS

| 3,945,825 A | 3/1976 | Gale et al. |
|---|---|---|
| 4,071,367 A | 1/1978 | Collier et al. |
| 4,087,300 A | 5/1978 | Adler |
| 4,423,956 A | 1/1984 | Gordon |
| 4,806,442 A | 2/1989 | Shirasaki et al. |
| 4,897,737 A | 1/1990 | Shalev |
| 4,965,118 A | 10/1990 | Kodera et al. |
| 5,175,072 A | 12/1992 | Martens |
| 5,281,511 A | 1/1994 | Gerhardt |
| 5,342,737 A | 8/1994 | Georger, Jr. et al. |
| 5,347,375 A | 9/1994 | Saito et al. |
| 5,620,817 A | 4/1997 | Hsu et al. |
| 6,045,980 A | 4/2000 | Edelkind et al. |
| 6,140,008 A | 10/2000 | Hsieh et al. |

(Continued)

FOREIGN PATENT DOCUMENTS

EP 0 530 674 A1 3/1993

(Continued)

OTHER PUBLICATIONS

Communication Pursuant to Article 96(2) EPC, EP Application No. 04 781 818.2, Jun. 20, 2006.

(Continued)

*Primary Examiner*—John A. McPherson
(74) *Attorney, Agent, or Firm*—Myers Bigel Sibley & Sajovec, P.A.

(57) ABSTRACT

Microstructures are fabricated by imaging a microstructure master blank that includes a radiation sensitive layer sandwiched between a pair of outer layers, on an imaging platform, to define the microstructures in the radiation sensitive layer. At least one of the outer layers is then removed. The microstructures that were defined in the radiation sensitive layer are developed. The radiation sensitive layer sandwiched between the pair of outer layers may be fabricated as webs, to provide microstructure master blanks.

19 Claims, 12 Drawing Sheets

U.S. PATENT DOCUMENTS

| | | | |
|---|---|---|---|
| 6,146,792 A * | 11/2000 | Blanchet-Fincher et al. | 430/7 |
| 6,313,956 B1 | 11/2001 | Saito | |
| 6,400,390 B1 | 6/2002 | Umeda et al. | |
| 6,410,213 B1 | 6/2002 | Raguin et al. | |
| 6,700,702 B2 | 3/2004 | Sales | |
| 7,192,692 B2 * | 3/2007 | Wood et al. | 430/320 |
| 2001/0008741 A1 | 7/2001 | Tomita et al. | |
| 2001/0017830 A1 | 8/2001 | Arai et al. | |
| 2002/0034014 A1 | 3/2002 | Gretton et al. | |
| 2002/0034710 A1 | 3/2002 | Morris et al. | |
| 2002/0039209 A1 | 4/2002 | Parker et al. | |
| 2002/0196325 A1 | 12/2002 | Pierson | |
| 2003/0091908 A1 * | 5/2003 | Takayanagi | 430/5 |
| 2004/0004770 A1 | 1/2004 | Ebina et al. | |
| 2004/0067323 A1 * | 4/2004 | Clabburn et al. | 428/1.26 |

FOREIGN PATENT DOCUMENTS

| | | | |
|---|---|---|---|
| EP | 0 338 766 B1 | | 8/1995 |
| EP | 0 712 032 B1 | | 12/2001 |
| EP | 1 199 602 A2 | | 4/2002 |
| EP | 0 726 142 B1 | | 5/2003 |
| JP | 60-156004 A | | 8/1985 |
| JP | 1-080901 A | * | 3/1989 |
| JP | 5-312594 A | | 11/1993 |
| WO | WO 02/41309 A1 | | 5/2002 |

OTHER PUBLICATIONS

Communication under Rule 112 EPC, EP Application No. 04 809 596.2, Jun. 23, 2006.

Invitation to Pay Additional Fees, Communication Related to the Results of the Partial International Search, PCT/US20004/027209, Dec. 6, 2004.

Invitation to Pay Additional Fees, Communication Related to the Results of the Partial International Seach, PCT/US2004/027208, Dec. 28, 2004.

Notification of Transmittal of the International Search Report and the Written Opinion of the International Searching Authority, or the Declaration, Written Opinion of the Inernational Searching Authority and International Search Report, PCT/US2004/027071, May 27, 2005.

Notification of Transmittal of the International Search Report and the Written Opinion of the International Searching Authority, or the Declaration, Written Opinion of the International Searching Authority and International Search Report, PCT/US2004/027209, Apr. 6, 2005.

Notification of Transmittal of the International Search Report and the Written Opinion of the International Searching Authority, or the Declaration, Written Opinion of the International Searching Authority and International Search Report, PCT/US2004/027208, Apr. 26, 2005.

Invitation to Pay Additional Fees, PCT/US2004/027071, Mar. 31, 2005.

Communication With European Search Report, EP Application No. 04809596.2, Nov. 2, 2006.

* cited by examiner

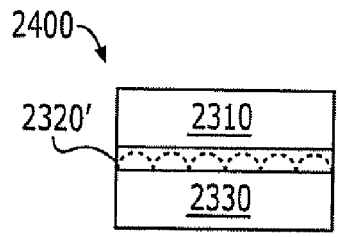
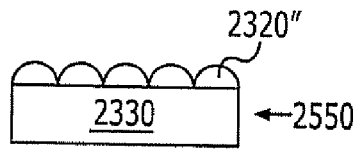
FIG. 26A  FIG. 26B
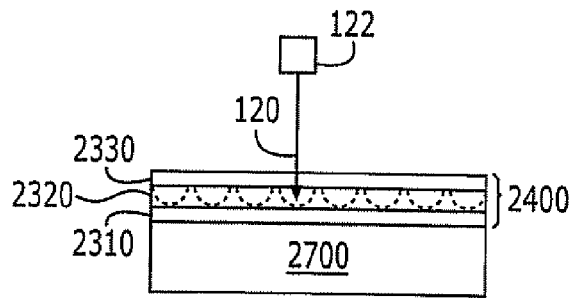
FIG. 27
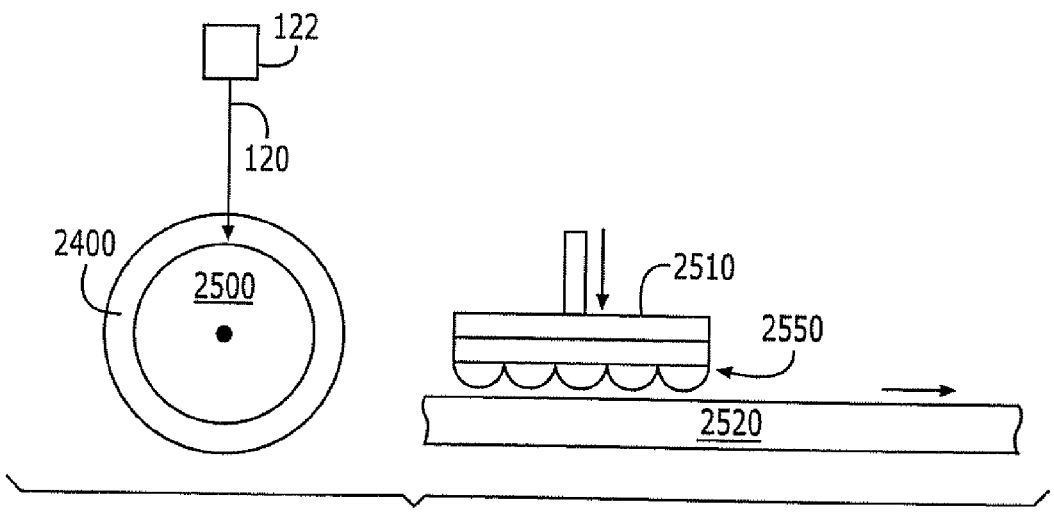
FIG. 28

METHODS FOR FABRICATING OPTICAL MICROSTRUCTURES BY IMAGING A RADIATION SENSITIVE LAYER SANDWICHED BETWEEN OUTER LAYERS

CROSS-REFERENCE TO RELATED APPLICATIONS

This application is a continuation of application Ser. No. 10/661,974, filed Sep. 11, 2003, now U.S. Pat. No. 7,192,692, entitled Methods For Fabricating Microstructures By Imaging A Radiation Sensitive Layer Sandwiched Between Outer Layers, and is related to application Ser. No. 10/661,916, filed Sep. 11, 2003, now U.S. Pat. No. 7,190,387, entitled Systems and Methods for Fabricating Optical Microstructures Using a Cylindrical Platform and a Rastered Radiation Beam to the present inventors, and application Ser. No. 10/661,917, filed Sep. 11, 2003, entitled Systems and Methods for Mastering Microstructures Through a Substrate Using Negative Photoresist and Microstructure Masters So Produced to the present inventors, all of which are assigned to the assignee of the present application, the disclosures of all of which are hereby incorporated herein by reference in their entirety as if set forth fully herein.

FIELD OF THE INVENTION

This invention relates to microfabricating methods and systems, and more particularly to systems and methods for fabricating microstructures and microstructures fabricated thereby.

BACKGROUND OF THE INVENTION

Optical microstructures are widely used in consumer and commercial products. As is well known to those having skill in the art, optical microstructures may include microlenses, optical gratings, microreflectors and/or other optically absorbing, transmissive and/or reflective structures, the individual sizes of which are on the order of microns, for example on the order of about 5 µm to about 1000 µm in size.

The fabrication of large arrays of optical microstructures is currently being investigated. As used herein, a large array of optical microstructures contains at least about one million optical microstructures and/or covers an area of at least about one foot square. For example, large arrays of microlenses may be used in computer displays (monitors) and/or projection televisions. It will be understood that an array can have uniform and/or nonuniform spacing of identical and/or nonidentical microstructures.

Unfortunately, however, severe scaling barriers may be encountered in attempting to fabricate large arrays of optical microstructures. These scaling barriers may make it difficult to efficiently produce large arrays of optical microstructures with acceptable manufacturing yields.

Several barriers may be encountered in attempting to scale optical microstructures to large arrays. First, the time to master a large array may be prohibitive. In particular, it is well known that optical microstructures may be initially imaged in a "master", which may then be replicated in one or more second generation stampers to eventually produce large quantities of end products. Unfortunately, it may be difficult to produce a master for a large array of optical microstructures within a reasonable time. For example, calculations may show that it may take years to create a single master for large screen rear projection television. These mastering times may be prohibitive for viable products.

It also may be difficult to image certain optical microstructures that may be desired for many applications. For example, computer displays or projection televisions may employ large arrays of microlenses, wherein each microlens comprises a hemispherical section, which can include a sub-hemisphere (subtends less than 180°), hemisphere (subtends about 180°) or super-hemisphere (subtends more than 180°). However, it may be difficult to master a large array of hemispherical sections using conventional photolithographic techniques. Finally, it may be difficult to efficiently replicate masters containing large arrays of optical microstructures to produce stampers, so as to enable high volume production of optical microstructure end products for display, television and/or other applications.

SUMMARY OF THE INVENTION

Some embodiments of the present invention fabricate microstructures by imaging a microstructure master blank that includes a radiation sensitive layer sandwiched between a pair of outer layers, on an imaging platform, to define the microstructures in the radiation sensitive layer. At least one of the outer layers is then removed. The microstructures that were defined in the radiation sensitive layer are developed. The developed microstructures can produce a microstructure master. The microstructures may comprise optical and/or mechanical microstructures. Subsequent steps can form second generation stampers from the microstructure master, and can fabricate end product microstructures from the stampers. In some embodiments, prior to imaging, the radiation sensitive layer that is sandwiched between a pair of outer layers is fabricated, for example as a web, and is placed on the imaging stage. Some embodiments of the present invention can thereby provide mass production of large microstructure masters.

In some embodiments, the pair of outer layers includes a first outer layer adjacent the imaging platform and a second outer layer remote from the imaging platform. After imaging, the second outer layer is removed from the radiation sensitive layer and the radiation sensitive layer is developed to create a master. A second generation stamper is then created from the microstructure master, by contacting the microstructures in the radiation sensitive layer to a stamper blank.

In particular, some embodiments of the present invention remove the imaged microstructure master from the imaging platform, and use the removed microstructure master to create the stampers. In particular, in some embodiments, the first outer layer is separated from the imaging platform, to thereby remove the imaged microstructure master from the imaging platform. The first or second outer layer is then separated from the radiation sensitive layer and the radiation sensitive layer is developed. A second generation stamper is then created from the microstructures that were developed in the radiation sensitive layer by contacting the microstructures in the radiation sensitive layer to a stamper blank. In some embodiments, the microstructures are pressed against the stamper blank. In other embodiments, the microstructures are rolled against the stamper blank.

Moreover, some embodiments of the present invention can use combinations of planar and/or nonplanar imaging and/or stamping platforms. More specifically, in some embodiments, the imaging platform is a planar imaging platform, and the second generation stamper is created from the microstructures that were developed in the radiation sensitive layer by pressing the microstructures in the radiation sensitive layer against a stamper blank. In other embodiments, the imaging platform is a cylindrical imaging platform and the second generation stamper is created by rolling the microstructures that were developed in the radiation sensitive layer against a stamper blank. Thus, these embodiments can also use the imaging platform itself as a stamping platform. Moreover, in other embodiments, the radiation sensitive layer that has been removed from the imaging platform is developed and is then attached to a planar or nonplanar stamping platform for creating stampers.

In some embodiments of the present invention, mass production and mass replication of masters may be provided. In particular, after a first microstructure master that comprises a radiation sensitive layer sandwiched between a pair of outer layers, is removed from the imaging platform, a second microstructure master that comprises a radiation sensitive layer sandwiched between a pair of outer layers, is imaged on the imaging platform, to define microstructures in the radiation sensitive layer. Imaging of the second microstructure master can at least partially overlap in time with creation of stampers from a previously imaged first microstructure master.

Embodiments of the invention have been described above primarily with respect to methods of fabricating microstructures. However, it will be understood by those having skill in the art that other embodiments of the invention can provide analogous systems for fabricating microstructures.

Apparatus for fabricating a blank for a microstructure master, according to some embodiments of the present invention, include a radiation sensitive material coating station that is configured to coat a layer of radiation sensitive material that is configured to accept an image of microstructures, on a first flexible web. A laminating station also is provided that is configured to laminate a second flexible web to the layer of radiation sensitive material that is configured to accept an image of microstructures, opposite the first flexible web. The radiation sensitive layer is a negative photoresist layer in some embodiments. The first and second flexible webs are identical in some embodiments. In other embodiments, the negative photoresist layer is sensitive to radiation at a predetermined frequency, the first flexible web is transparent to radiation at the predetermined frequency. In yet other embodiments, the second flexible web is opaque to radiation at the predetermined frequency. Analogous methods of fabricating a blank for a microstructure master also may be provided.

Blanks for microstructure masters according to some embodiments of the present invention include a pair of closely spaced apart, flexible webs, and a radiation sensitive layer that is configured to accept an image of microstructures between the pair of closely spaced apart, flexible webs. In some embodiments, the radiation sensitive layer contains therein a latent image of optical microstructures. In some embodiments, the radiation sensitive layer is a negative photoresist layer.

In some embodiments, the pair of flexible webs are identical. In other embodiments, the negative photoresist layer is sensitive to radiation at a predetermined frequency, and the pair of flexible webs are transparent to radiation at the predetermined frequency. In yet other embodiments, one of the pair of flexible webs is transparent to radiation at the predetermined frequency, and the other of the pair of flexible webs is opaque to radiation at the predetermined frequency. These blanks may be used to form large area masters for microstructures according to some embodiments of the present invention.

BRIEF DESCRIPTION OF THE DRAWINGS

FIGS. 25A-25E, 26A-26B and 27 are cross-sectional views of systems and methods of fabricating optical microstructures according to various embodiments of the present invention.

FIG. 28 is a schematic view of systems and methods for mass production of masters and stampers for optical microstructures according to some embodiments of the present invention.

DETAILED DESCRIPTION

Figure 1:
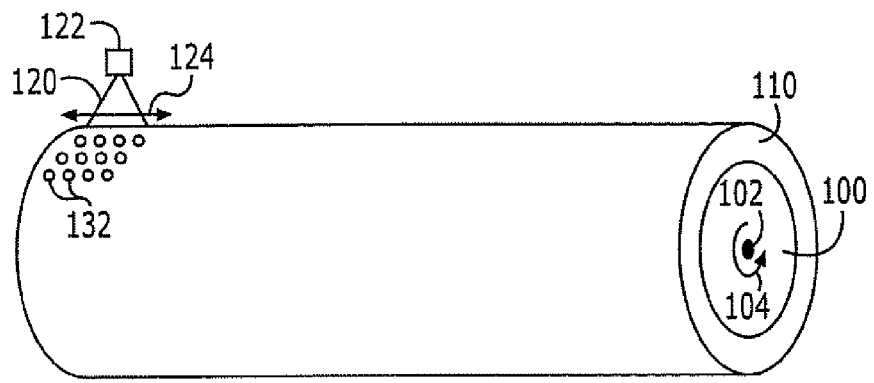
FIGS. 1-4 are perspective views of systems and methods of fabricating microstructures according to various embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "top" or "outer" may be used herein to describe a relationship of one layer or region to another layer or region relative to a base structure as illustrated in the figures. It will be understood that these relative terms are intended to encompass different orientations of the device in addition to the orientation depicted in the figures. Finally, the term "directly" means that there are no intervening elements.

Embodiments of the present invention will be described herein relative to the fabrication of optical microstructures, which may include microlenses, optical gratings, microreflectors and/or other optically-absorbing transmissive and/or reflective structures, the individual sizes of which are on the order of microns, for example on the order of about 5 µm to about 1000 µm, in size. However, it will be understood that other embodiments of the present invention may be used to fabricate mechanical microstructures such as pneumatic, hydraulic and/or microelectromechanical system (MEMS) microstructures, which may be used for micro-fluidics, micro-pneumatics and/or micromechanical systems, the individual sizes of which are on the order of microns, for example on the order of about 5 µm to about 1000 µm, in size.

FIG. 1 is a perspective view illustrating systems and methods of fabricating optical microstructures according to some embodiments of the present invention. As shown in FIG. 1, a cylindrical platform or drum 100 that includes a radiation sensitive layer 110 thereon, is rotated about an axis 102 thereof, for example in a direction shown by the arrow 104. As used herein, the term "radiation sensitive" encompasses any photo-imageable material, including, but not limited to, photoresist. As also shown in FIG. 1, simultaneously, a radiation beam such as a laser beam 120, generated by a laser 122, is axially rastered or scanned in opposite axial directions shown by the arrows 124, across at least a portion of the radiation sensitive layer 110, to image optical microstructures 132 in the radiation sensitive layer 110. The image so formed may also be referred to as a latent image. It will be understood that, although embodiments of the invention are generally described herein with respect to laser beams and laser sensitive photoresists, other coherent or incoherent radiation beams, such as electron beams, may be used, along with compatible radiation sensitive layers.

It will also be understood by those having skill in the art that the radiation sensitive layer 110 may be directly on the cylindrical platform 100, as shown in FIG. 1, or one or more intervening layers may be provided between the radiation sensitive layer 110 and the cylindrical platform 100, as will be described in detail below. Moreover, one or more layers may be provided on the radiation sensitive layer 110, remote from the cylindrical platform 100, as will be described in detail below. Other embodiments of the radiation sensitive layer 110 also will be described below. Moreover, the cylindrical platform 100 may be rotated about axis 102 at a constant angular velocity and/or at variable angular velocity.

Still referring to FIG. 1, in some embodiments, the laser 122 is a Continuous Wave (CW) laser that emits radiation at a frequency or frequency band to which the radiation sensitive layer 110 is sensitive. In some embodiments, the laser beam 120 may be rastered axially over the entire axial length of the cylindrical platform 100. However, in other embodiments, as will be described in more detail below, the laser beam 124 may be rastered over relatively small portions of the cylindrical platform 100.

Finally, it will be understood that, although only a small number of optical microstructures 132 are shown for the sake of illustration, conventionally large numbers of optical microstructures 132 are fabricated to provide, in some embodiments, a large array of optical microstructures. Although optical microstructures 132 are shown in FIG. 1 as being microlenses in the shape of a hemispherical section, in other embodiments other microstructures, such as optical grating structures, may be formed as a plurality of uniformly and/or non-uniformly spaced, identical and/or non-identical optical microstructures 132. Combinations of different types of optical microstructures, with uniform and/or nonuniform sizes and/or spacings, also may be fabricated.

Figure 2:
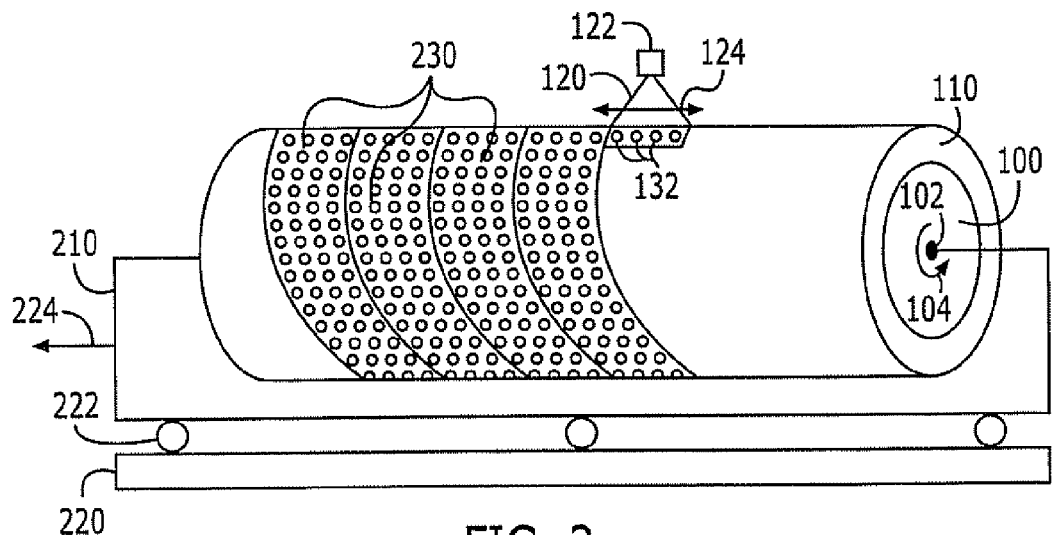
Figure 3:
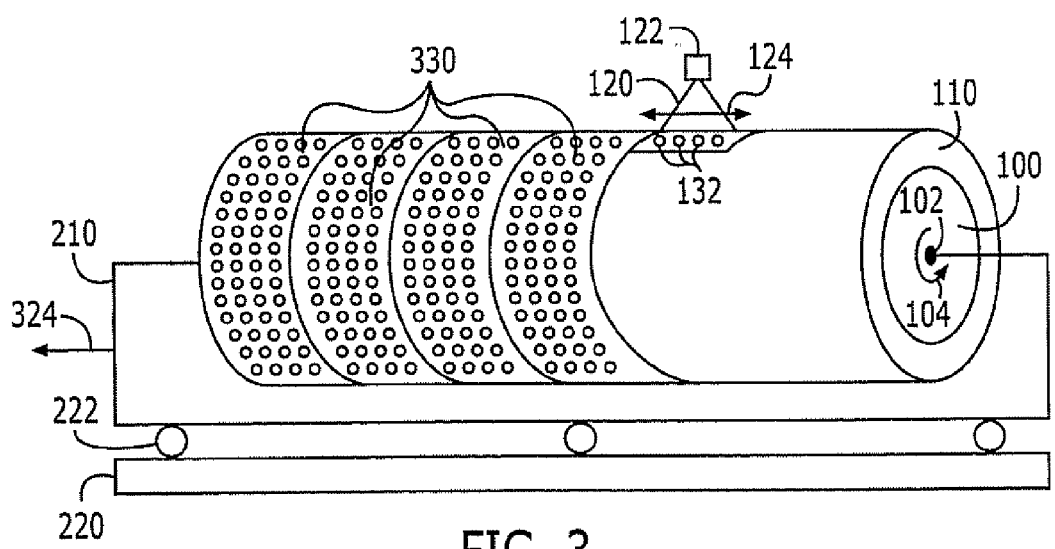
Figure 4:
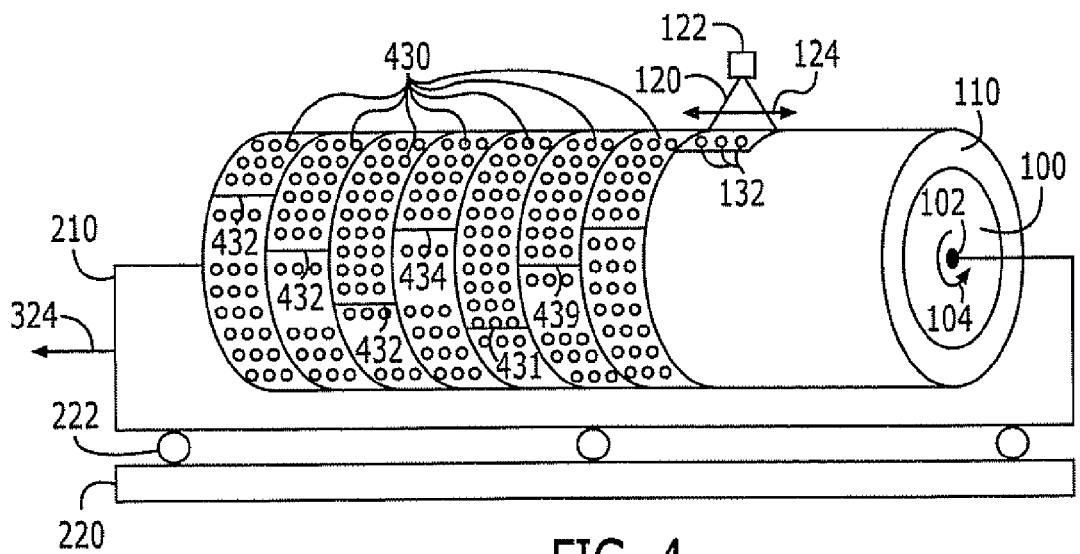

FIGS. 2-4 illustrate other embodiments of the present invention wherein the cylindrical platform 100 and/or the laser beam 120 are translated axially relative to one another, simultaneous with the platform rotation and beam rastering, to image the optical microstructures across at least a substantial portion of the length of the cylindrical platform 100. In some embodiments, the axial translation can allow optical microstructures to be formed across substantially the entire axial length of the cylindrical platform 100. In some embodiments, the cylindrical platform 100 may be maintained at a fixed axial position and the laser 122 and/or the laser beam 120 may be translated along the axial direction. In other embodiments, the laser 122 and/or laser beam 120 may be maintained in a fixed axial location and the cylindrical platform 100 may be translated axially. In still other embodiments, both the laser 122 and/or laser beam 122, and the cylindrical platform 100, may be translated relative to one another axially. For example, the laser 122 may be fixed at one end of the cylindrical platform 100 and laser optics such as a mirror may be configured to translate the laser beam 122 relative to the cylindrical platform, for example by moving axially and/or rotating.

FIGS. 2-4 illustrate embodiments of the present invention wherein the cylindrical platform 100 is translated axially relative to a fixed laser 122. More specifically, referring to FIG. 2, the cylindrical platform 100 is translated axially along an axial translation direction shown by arrow 224, by moving a support 210 relative to a base 220 using rollers 222 and/or other conventional mechanisms. As shown in FIG. 2, continuous translation of the cylindrical platform 110 along the translation direction 224 is provided, to thereby image the optical microstructures 132 in a continuous spiral pattern 230 in the radiation sensitive layer 110.

FIG. 3 illustrates other embodiments of the present invention wherein a stepwise translation of the cylindrical platform 100 relative to the laser beam 120, along a translation direction 324, is provided, to thereby image the optical microstructures 132 in discrete bands 330 in the radiation sensitive layer. In embodiments of FIG. 3, continuous rotation of the cylindrical platform 100 in the rotation direction of arrow 104 may be provided and stepwise translation of the cylindrical platform may be provided along a translation direction 324 after an individual band 330 has been imaged. It will be understood that the cylindrical platform 100 may continue to rotate through less than one, one, or more than one complete revolutions during the stepwise translation of the cylindrical platform 100.

In FIG. 3, imaging of each band 330 begins and ends at the same predetermined rotation angle of the cylindrical platform 100, to thereby provide a pattern of aligned bands 330 in the radiation sensitive layer 110. A guardband may be provided in a band, to separate the beginning and end of the band from one another. Alternatively, the beginning and end of a band may abut against one another.

In contrast, in FIG. 4, the cylindrical platform 100 is stepwise translated axially along the translation direction 324 at staggered rotation angles of the cylindrical platform 100, to thereby image the optical microstructures 132 in a staggered band pattern 430. In some embodiments, the beginning and/or ends of a band may be uniformly staggered relative to one another, as shown by the band beginnings/ends 432. In other embodiments, non-uniform staggering of band beginnings/ends, as shown at 434, may be provided. Combinations of aligned (FIG. 3) and staggered (FIG. 4) band patterns also may be provided. It also will be understood that combinations of the imaging systems and methods of FIGS. 1-4 may be provided in a single radiation sensitive layer 110. In some embodiments, the spiral/band structures of FIGS. 2-4 may not be detected after all the optical microstructures are imaged and developed so that uniformly spaced optical structures are produced. However, in other embodiments, at least some aspects of the spiral/band structures may be detected after development.

FIGS. 5A-5C and 6A-6C illustrate the rastering of a radiation beam, such as a laser beam 120, across at least a portion of a radiation sensitive layer, such as a radiation sensitive layer 110 of FIG. 1, to image optical microstructures, such as the optical microstructures 132 of FIGS. 1-4, in the radiation sensitive layer, according to various embodiments of the present invention. For ease of illustration, only a portion of the radiation sensitive layer 110 and the microstructures 132 are shown.

Figure 5A:
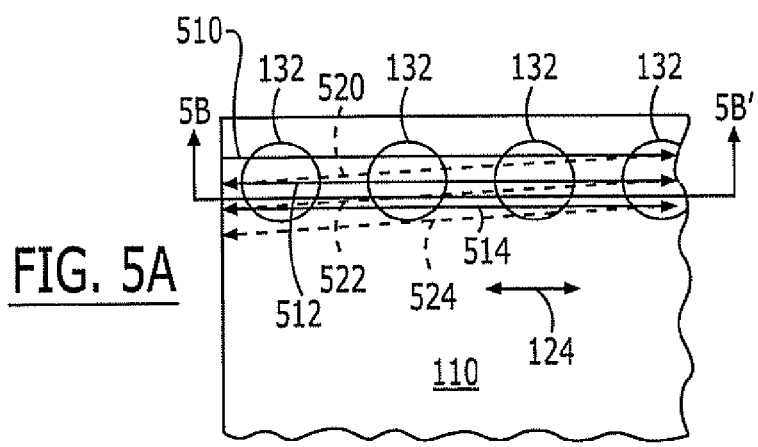
FIGS. 5A-5C and 6A-6C illustrate rastering of a radiation beam across at least a portion of a radiation sensitive layer according to various embodiments of the present invention.
Figure 5B:
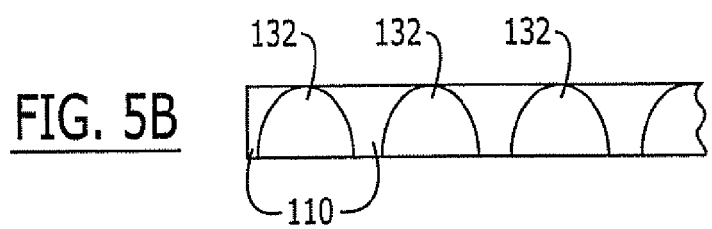
Figure 5C:
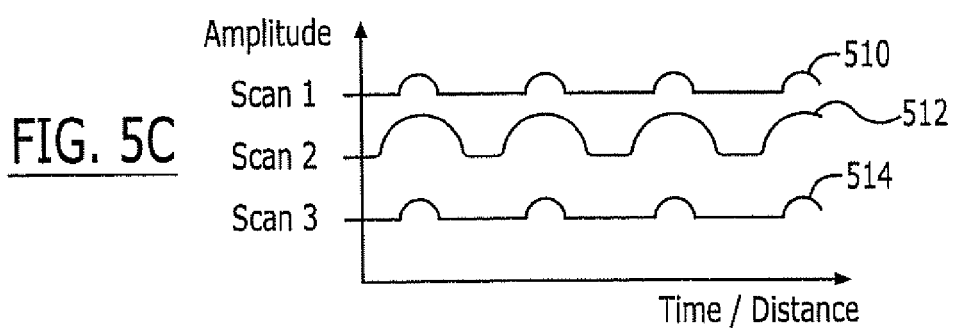

FIG. 5A is a top view of a portion of the radiation sensitive layer 110 and FIG. 5B is a cross-sectional view of the radiation sensitive layer 110 taken through line 5B-5B' of FIG. 5A. As shown in FIGS. 5A and 5B, the radiation beam, such as the laser beam 120 of FIGS. 1-4, is axially rastered across at least a portion of the radiation sensitive layer 110, to image the optical microstructures 132 in the radiation sensitive layer, by axially rastering the laser beam 120 across at least a portion of the radiation sensitive layer 110, while varying the amplitude of the laser beam. More specifically, as shown in FIGS. 5A-5C, axial rastering takes place by axially rastering the laser beam 120 across at least a portion of the radiation sensitive layer 110 while varying the amplitude of the laser beam, to thereby image the optical microstructures 132 in the radiation sensitive layer 110. In particular, as shown in FIG. 5A, in some embodiments, the rastering may provide three scans 510, 512, 514 across the radiation sensitive layer 110 in the axial direction 124. The scans are spaced apart from one another due to the rotation of the cylindrical platform 100. In FIG. 5A, the laser beam is rastered along a first axial direction, shown as to the right in FIG. 5A, to image the optical microstructures and then blanked, as shown by dashed lines 520, 522 and 524 in a second axial direction that is opposite the first axial direction, shown as to the left in FIG. 5A. During the axial scans 510, 512, 514, the amplitude of the laser beam may be varied as shown in FIG. 5C, to produce the optical microstructures 132.

Thus, as shown in FIGS. 5A-5C, the amplitude of the laser beam 120 is continuously varied to image the optical microstructures 132 in the radiation sensitive layer 110. Moreover, the axial rastering is performed at sufficient speed, relative to the rotating of the cylindrical platform 100, such that the laser beam 120 images an optical microstructure 132 over a plurality of scans of the laser beam, shown as three scans 510, 512, 514 in FIGS. 5A-5C. It will be understood that, in some embodiments, an optical microstructure may be imaged in a single scan and, in other embodiments, two scans or more than three scans may be used. Moreover, in some embodiments, a plurality of lasers may be used to perform more than one scan simultaneously.

It also will be understood that the amplitude of the laser beam 120 may not be a linear function of the shape of the optical microstructure that is being imaged, due to nonlinear absorption/development characteristics of the radiation sensitive layer 110 and/or other well-known nonlinear effects. In particular, the prediction of the shape that will result from the imaging may involve a detailed understanding not only of the beam profile and intensity, and the way in which they vary in space and time, but also the manner in which the radiation sensitive layer responds to the radiation energy deposited in it ("exposure curves"). In addition to the parameters involved in the exposure, the response of the radiation sensitive layer can also be affected by various post-exposure development parameters. The desired amplitude of the laser beam 120 during a scan may be determined empirically by trial and error, to arrive at a desired amplitude that produces a desired image of an optical microstructure, by using simulators, by using a mathematical convolution function that defines the relationship between laser dose and a developed image in a radiation sensitive layer and/or by using other conventional techniques that need not be described in detail herein.

Figure 6A:
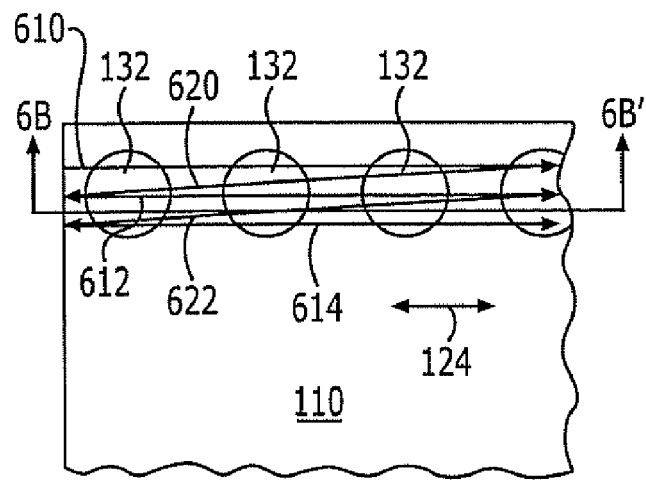
Figure 6B:
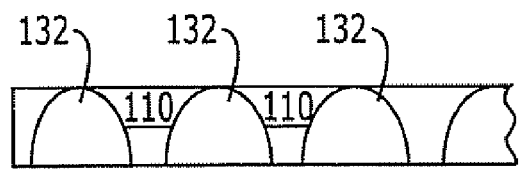
Figure 6C:
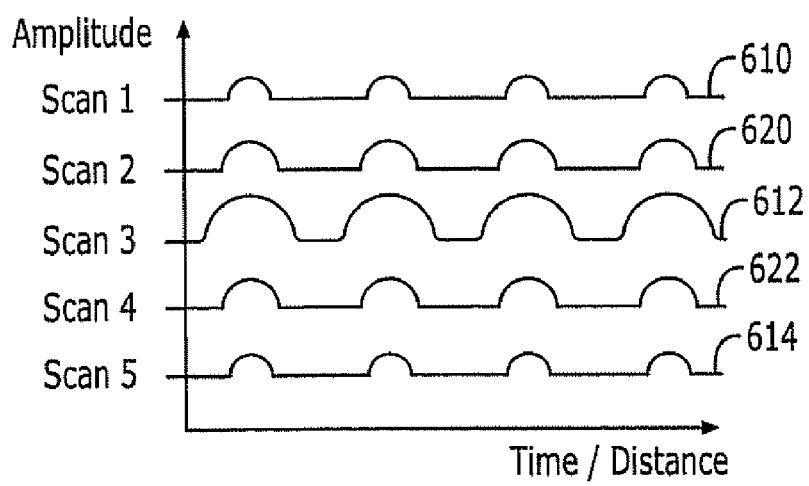

FIGS. 6A-6C illustrate other embodiments of the invention wherein the radiation sensitive layer 110 is imaged during forward and return scanning of the laser beam rather than blanking the laser beam 120 during its return. Higher density and/or higher speed may thereby be obtained at the potential expense of greater complexity. Thus, as shown in FIGS. 6A-6C, imaging is performed in a first (forward) axial direction, shown as to the right in FIG. 6A by scan lines 610, 612 and 614, and in a second direction that is opposite the first direction, shown as to the left in FIGS. 6A-6C, during return scans 620 and 622. As was the case with respect to FIG. 5, fewer or larger numbers of scans may be provided. It also will be understood that embodiments of FIGS. 5 and/or 6 may be combined with any of the embodiments of FIGS. 1-4.

Figure 7:
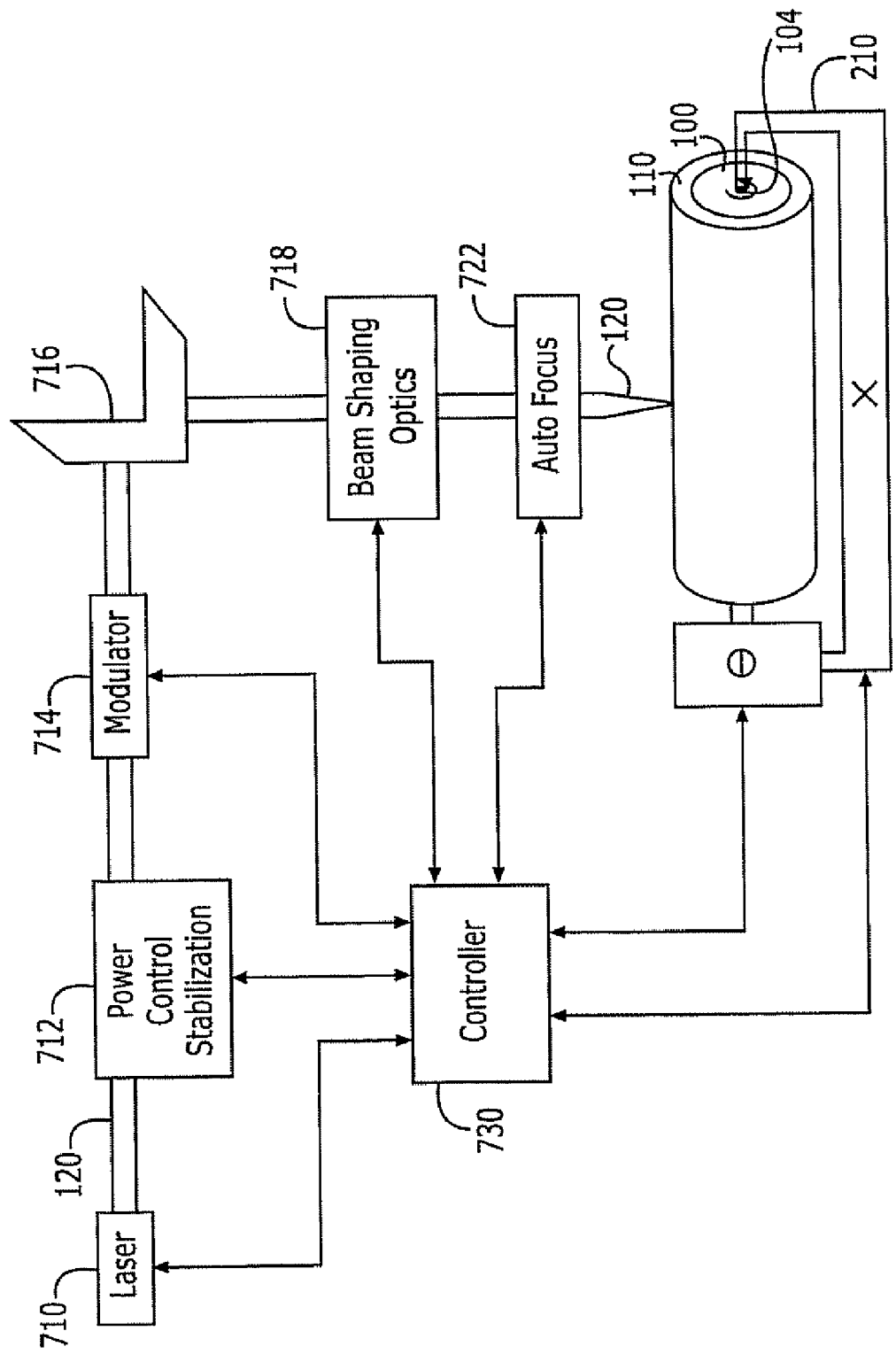
FIG. 7 is a block diagram of systems and methods for fabricating optical microstructures according to other embodiments of the present invention.

FIG. 7 is a block diagram of other systems and methods for fabricating optical microstructures according to other embodiments of the present invention. As shown in FIG. 7, a continuous wave laser beam 120 is generated by a continuous wave laser 710, and power control stabilization may be provided by a power control stabilizer 712. In other embodiments, a "quasi-continuous wave" laser beam may be provided, using, for example, a switchable semiconductor laser. A modulator 714, which in some embodiments may be an acoustooptical (AO) modulator 714, is used to vary the amplitude of and raster the laser beam 120. In some embodiments, separate modulators may be used to modulate the amplitude of the laser beam 120 and to raster the position of the laser beam 120. The modulator 714 is capable of imparting angular deflection to the beam, to provide a limited range of motion, without having to move the platform 100 on which the radiation sensitive layer 110 is placed. Moreover, other conventional techniques for changing the amplitude and/or position of the laser beam 120 also may employed. For example, the amplitude of the laser beam may be changed at the laser 710 itself, and the position may be rastered using a conventional scanner that employs rotating and/or oscillating mirrors.

Continuing with the description of FIG. 7, a mirror, prism and/or other optical element(s) 716 may be used to change the direction of the laser beam 120 if desired. Beam shaping optics 718 may be used to control the shaping of the laser beam 120, to form an ellipsoidal (such as circular) and/or polygonal (such as square) beam with an intensity profile thereacross which may be constant, Gaussian and/or follow other conventional profiles. An auto-focus system 722 also may be provided to control the focal point of the laser beam 120 relative to the cylindrical platform 100. The design and operation of Blocks 710-722 are well known to those having skill in the art and need not be described in detail herein. These blocks may be referred to collectively as an optical train, or as a radiation beam system. Moreover, it will be understood that some of the Blocks 712-722 need not be used in optical trains or radiation beam systems according to other embodiments of the present invention. Accordingly, embodiments of FIG. 7 can generate a continuous wave laser beam 120 and modulate the laser beam to vary an amplitude thereof while simultaneously oscillating the laser beam to raster the laser beam across at least a portion of the radiation sensitive layer 110.

In particular, it may be difficult to fabricate microstructures with uniform and/or varying profiles and/or heights with high accuracy. Some embodiments of the present invention can use continuously varying intensity radiation beam, such as a laser beam 120, to form optical microstructures. This can allow creation of arbitrary three-dimensional profiles of optical elements in real time with high accuracy. In order to produce features at a high enough rate to permit the mastering of large numbers of optical microstructures using multiple exposures per optical microstructure, the laser beam 120 may be modulated in intensity and spatially at a rate of at least about 1 kHz and, in some embodiments, at MHz rates. AO modulation can provide this capacity, since the beam can be rastered and amplitude modulated at these frequencies. The focal plane or other aspects of the beam profile also may be changed rapidly, to vary the depth in the radiation sensitive layer 110 at which a maximum amount of radiation energy is deposited.

Still continuing with the description of FIG. 7, a control system and/or method, also referred to herein as a controller, also may be provided. The controller 730 may include dedicated hardware and/or one or more enterprise, application, personal, pervasive or embedded computer systems that may be interconnected via a network, to execute one or more computer programs. The controller 730 may be centralized and/or distributed. The controller 730 may be used to control some or all of blocks 710-722 using conventional control techniques. In addition, the controller 730 may be designed to control the angular rotation θ of the cylindrical platform 100, the translation X of the cylindrical platform 100, and the amplitude and position of the laser beam 120 relative to time, to image optical microstructures according to any of the embodiments that are described herein, or combinations thereof. The design of a controller is well known to those having skill in the control art, and need not be described further herein.

In some embodiments, the controller 730 is capable of synchronizing the beam exposure and placement as provided by Blocks 710-722, with the desired physical location on the radiation sensitive layer 110 where the exposure is to take place. In some embodiments, systems/methods of FIG. 7 may be in operation for periods of up to about 24 hours or more at a time, so that the controller 730 should be capable of maintaining parameters within their desired tolerances over this period of time.

Moreover, in some embodiments of the present invention, the controller 730 can control an auto-focus system 722, to perform additional functions. In particular, in some embodiments, the focal length of the laser beam 120 may be varied simultaneous with the rotation of the cylindrical platform 100 and the axial rastering the laser beam 120, to at least partially compensate for radial variation in the cylindrical platform 100 and/or thickness variation in the radiation sensitive layer 110. In other embodiments, the focal length of the laser beam 120 also may be varied to image portions of the optical microstructures at varying depths in the radiation sensitive layer 110. In still other embodiments, the focal length of the laser beam 120 is varied to vary the exposure of the radiation sensitive layer 110, to provide the desired optical microstructure. Combinations and subcombinations of these focal length control mechanisms may be provided, alone or in combination with amplitude control of the laser beam 120.

In some embodiments, the optical microstructures 132 that is imaged in the radiation sensitive layer 110 of FIGS. 1-7 is developed at a developing station, as will be described in detail below. The developed radiation sensitive layer can provide a master for optical microstructure end products, which may be used, for example, in computer displays and/or televisions.

Additional discussion of embodiments of the present invention that were illustrated in FIGS. 1-7 now will be provided. In particular, as was described above, conventional approaches for mastering optical microstructures may encounter severe scaling barriers when applied to at least about one million elements and/or covering at least about one foot square in area. In these structures, it may be difficult to image a master in a reasonable time. In sharp contrast, some embodiments of the present invention can perform on the order of one million separate exposures per second, with sufficient resolution and accuracy to produce on the order of 10,000 optical microstructures per second, so that a master for a large rear screen projection television can be fabricated in hours, rather than years using conventional technologies.

Some embodiments of the present invention can place a small laser beam, for example of diameter of about 5 µm, of sufficient intensity to expose a radiation sensitive layer, and modulate this beam in intensity and location at, for example, MHz speeds. A cylindrical platform on which the radiation sensitive layer can be placed or mounted, can be moved accurately and quickly by computer control. A control system synchronizes the placement of the modulated beam on the platform, to expose the proper portion of the radiation sensitive layer with the correct amount of radiation.

Dimensions and speeds according to some embodiments of the present invention will now be provided, to provide an appreciation of the scale in which some embodiments of the present invention may operate. However, these dimensions and speeds shall be regarded as examples, and shall not be regarded as limiting. In particular, in some embodiments of the present invention, the cylindrical platform 100 may be about three feet in length and about five feet in circumference. The radiation sensitive layer 110 may be between about 10 µm and about 150 µm thick. A band of the rastered laser beam 124 may be between about 1 µm and about 1000 µm in axial length. A hemispherical section lens that is about 75 µm in diameter may be fabricated using 10 scans per lens, wherein return scans are blanked. The cylindrical platform 100 may rotate at an angular velocity of about 60 revolutions/minute and the rastering may be performed at a frequency of about 500,000 scan/sec. Given these parameters, it may take about 2 hours to fabricate about 200 million microlenses.

Figure 8:
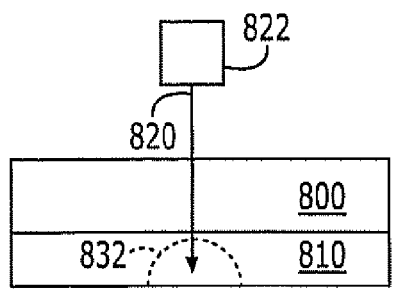
FIG. 8 is a cross-sectional view of systems and methods for fabricating optical microstructures according to yet other embodiments of the present invention.

FIG. 8 is a cross-sectional view of systems and methods for fabricating optical microstructures according to other embodiments of the present invention. As shown in FIG. 8, a radiation beam such as a laser beam 820 from a laser 822, which may correspond to the laser 110 and/or 710 of FIGS. 1-7, is impinged through a substrate 800 that is transparent thereto into a radiation sensitive layer 810 thereon, which may correspond to the radiation sensitive layer 110 of FIGS.

1-7, to image optical microstructures 832, which may correspond to optical microstructures 132 of FIGS. 1-7, in the radiation sensitive layer 810. As was already described, the radiation beam may be coherent and/or incoherent. Moreover, as used herein, a "transparent" substrate allows at least some of the incident radiation to pass therethrough. Imaging of a radiation beam through a substrate that is transparent thereto into a radiation sensitive layer 810 on the substrate may be referred to herein as "back-side" imaging or "substrate incident" imaging. It will be understood by those having skill in the art that, in FIG. 8, although the substrate 800 is shown above the radiation sensitive layer 810, other orientations of the substrate 800, radiation sensitive layer 810, laser beam 820 and laser 822 may be used to provide back-side imaging, according to various embodiments of the present invention.

Moreover, in providing back-side imaging of radiation sensitive layers 810 to fabricate optical microstructures 832 according to some embodiments of the present invention, many systems and methods may be used to move the laser beam 820 and the substrate 800 relative to one another. Some of these systems and methods are illustrated in FIGS. 9-11.

Figure 9:
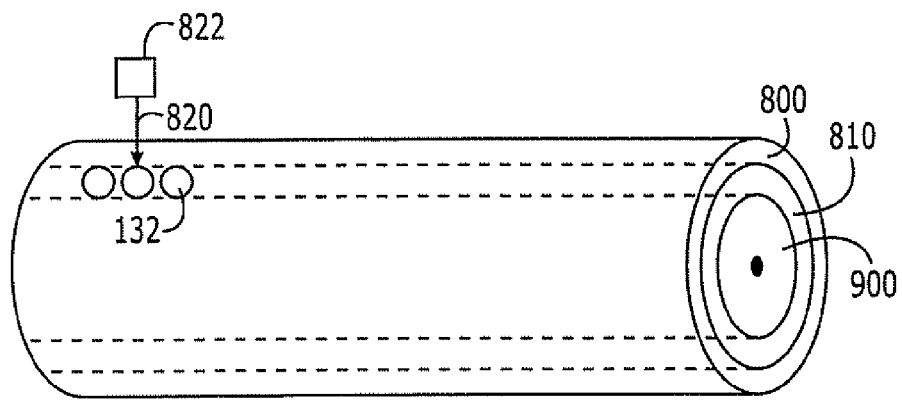
FIGS. 9-11 are perspective views of systems and methods for fabricating optical microstructures according to still other embodiments of the present invention.

In particular, referring to FIG. 9, a cylindrical platform 900, which may correspond to the platform 100 of FIGS. 1-7, may be used according to any of the embodiments that were described above in connection with FIGS. 1-7. Thus, as shown in FIG. 9, a laser beam 820 is impinged through a cylindrical substrate 800 into a cylindrical radiation sensitive layer 810 that is on a cylindrical platform 900. The substrate 800 may be flexible. In yet other embodiments, the structure of FIG. 9 may be used independent of any of the embodiments of FIGS. 1-7. Moreover, in still other embodiments, the laser beam 820 may be produced and/or directed inside the cylindrical platform 900, and the cylindrical platform 900 may constitute a transparent substrate.

Figure 10:
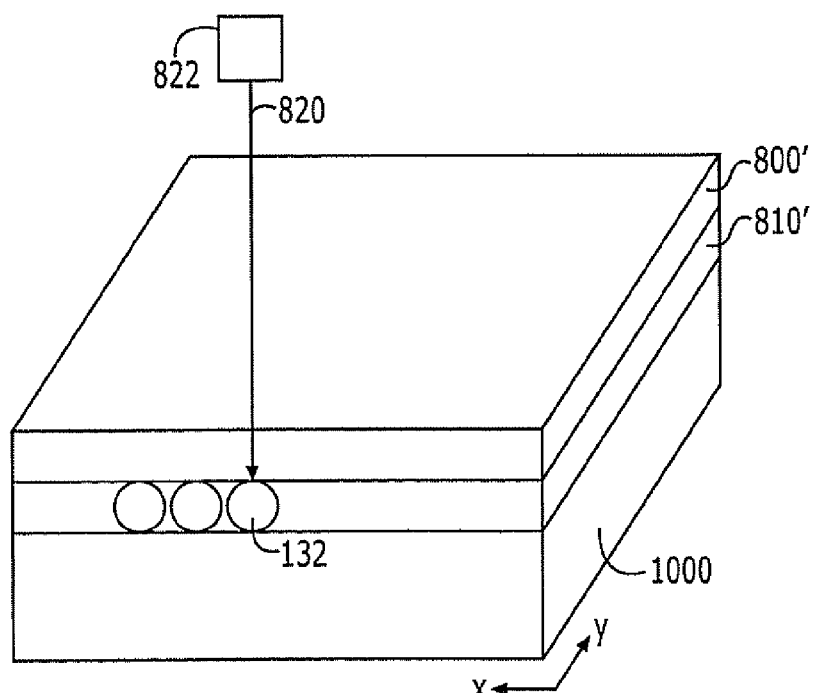

FIG. 10 illustrates other embodiments wherein a laser beam 820 is impinged through a polygonal substrate 800' into a polygonal-shaped radiation sensitive layer 810' that is on a polygonal platform 1000. In some embodiments, the substrate 800' is rectangular or square, the radiation sensitive layer 810' is rectangular or square, and the polygonal platform 1000 is a rectangular or square high precision X-Y table that can be translated continuously and/or in a stepwise manner along orthogonal X and/or Y directions, as shown in FIG. 10.

Figure 11:
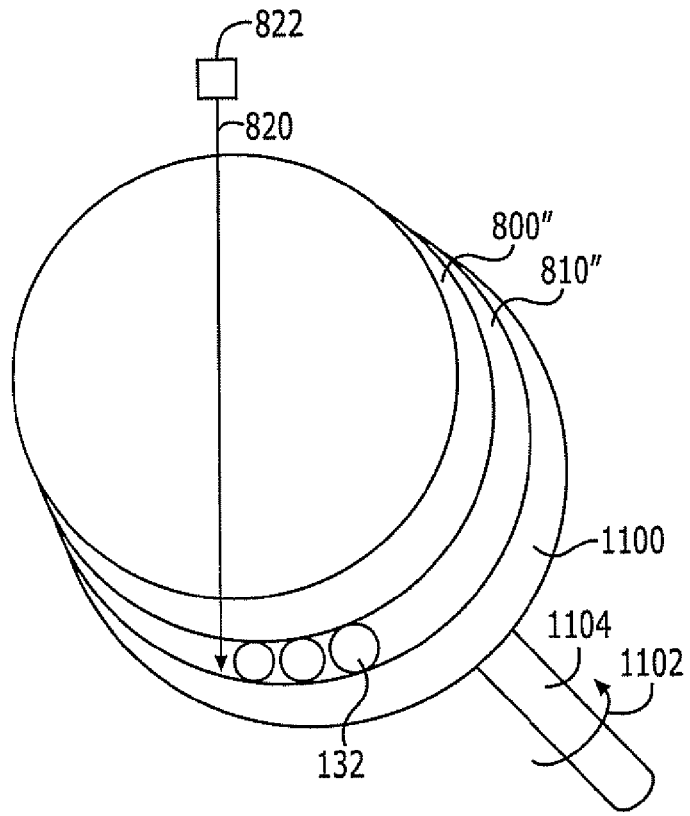

Finally, FIG. 11 illustrates other embodiments wherein a laser beam 820 is impinged through an ellipsoidal substrate 800" into an ellipsoidal radiation sensitive layer 810", on an ellipsoidal platform 1100. In some embodiments, the ellipsoidal substrate 800" is a circular substrate 800", the ellipsoidal radiation sensitive layer 810" is a circular radiation sensitive layer, and the ellipsoidal platform 1100 is a circular platform that is mounted on a spindle 1104 for rotation, as shown by arrow 1102.

In any of the embodiments of FIGS. 9-11, an optical train or system corresponding, for example, to elements 710, 712, 714, 716, 718 and/or 722 of FIG. 7 may be provided, along with a controller such as controller 730 of FIG. 7. Similarly, in any of the embodiments of FIGS. 9-11, the laser beam may be maintained stationary and/or may be rastered, and relative translation between the radiation sensitive layer and the laser beam may be provided by translation of the laser 822, the laser beam 820 and/or the platform 100, 1000 or 1100, as was already described in connection with FIGS. 1-7.

Figure 12:
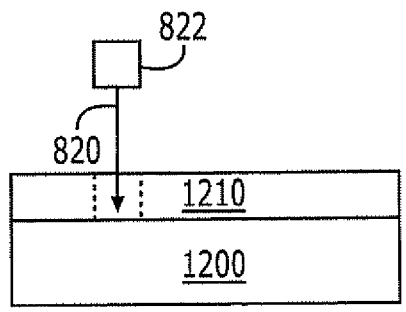
FIG. 12 is a cross-sectional view of systems and methods for fabricating optical microstructures according to other embodiments of the present invention.

FIG. 12 is a cross-sectional view of other embodiments of the present invention. In these embodiments, a negative photoresist layer 1210 is used as a radiation sensitive layer, with or without a substrate 1200, and a radiation beam such as a laser beam 820 is impinged into the negative photoresist layer. Embodiments of FIG. 12 may be used in combination with any of the embodiments described above or which will be described below.

As is well known to those having skill in the art, photoresist is available in two tones: positive and negative. Positive photoresist is designed so that the areas of photoresist that are exposed to radiation are removed in the development process. Negative photoresist is designed so that the areas of photoresist that are exposed to radiation remain after development and the unexposed portions are removed. Both types have been used in conventional integrated circuit fabrication, although positive photoresist now may be more commonly used due to its ease of adaptation to integrated circuit fabrication. Conventionally, negative photoresist may not be regarded as being applicable for fabricating optical microstructures. See, for example, U.S. Published Patent Application 2002/0034014 entitled Microlens Arrays Having High Focusing Efficiency, to Gretton et al., published Mar. 21, 2002.

In particular, in a negative photoresist, only the portion of the photoresist which is exposed will remain after developing. Thus, in a thick film of photoresist, such as may be used to fabricate optical microstructures, only a shallow portion of an outer layer of the photoresist layer may be exposed. The latent image that is formed by exposure may then be washed away when the unexposed photoresist beneath it is removed during development. Some embodiments of the present invention may arise from a realization that negative photoresist may indeed be used in fabricating optical microstructures. In fact, some embodiments of the invention may arise from a realization that negative photoresist may provide advantages in fabricating optical microstructures, especially when coupled with back-side imaging. One example of a negative photoresist that can be used is SU-8™, which is a negative photoresist formed of epoxy novolac polymers and marketed by Micro-Chem Corp.

Figure 13A:
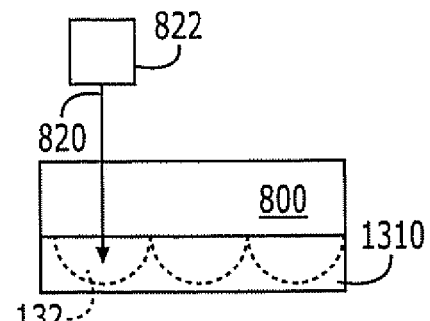
FIG. 13A is a cross-sectional view of systems and methods for fabricating optical microstructures according to still other embodiments of the present invention.
Figure 13B:
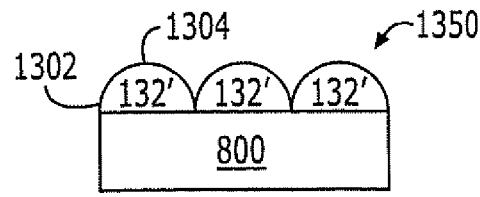
FIG. 13B is a cross-sectional view of an imaged negative photoresist layer after development according to embodiments of the present invention.

FIGS. 13A-13B are cross-sectional views of embodiments of the present invention that combine back-side imaging of, for example, FIG. 8, along with the use of negative photoresist of, for example, FIG. 12. In particular, as shown in FIG. 13A, a radiation beam such as a laser beam 820 is impinged through a substrate 800 that is transparent thereto into a negative photoresist layer 1310 on the substrate 800, to image optical microstructures 132 therein. Accordingly, FIG. 13A also illustrates optical microstructure products, according to some embodiments of the invention, which include a substrate 800 and an exposed layer of negative photoresist 1310 on the substrate 800, which is exposed to define thereon optical microstructures 132. FIG. 13B illustrates the imaged negative photoresist layer 1310 after development, to form optical microstructures 132'. Accordingly, FIG. 13B also illustrates optical microstructure products 1350, according to some embodiments of the invention, which may provide an optical microstructure master, and which include a substrate 800 and a patterned layer of negative photoresist on the substrate 800, which is patterned to define optical microstructures 132' thereon. It will be understood that any of the embodiments of FIGS. 1-11 may be used to fabricate embodiments of FIGS. 13A and 13B.

Back-side imaging into a negative photoresist layer according to some embodiments of the present invention may provide many potential advantages with respect to the fabrication of an optical microstructure master. Some potential advantages now will be described in detail.

Figure 14:
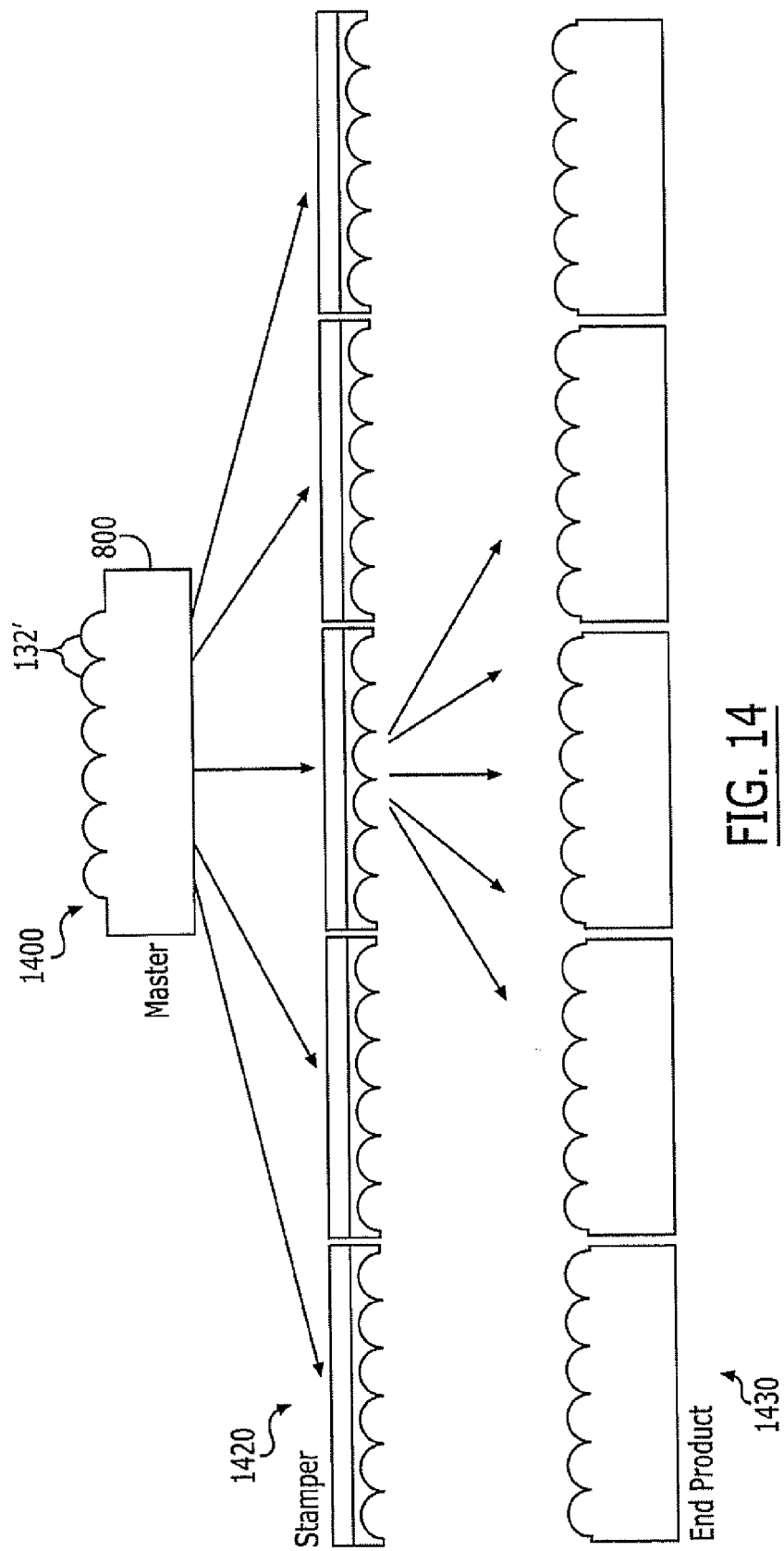
FIG. 14 is a flow diagram illustrating replication of a master into stampers and end products according to various embodiments of the present invention.

In particular, as is well known to those having skill in the art, once a master is created, a conventional replication process may then be employed to make multiple copies from the master. Each generation of replica generally is a negative of the previous generation. Referring to FIG. 14, a master 1400 may be created using back-side imaging through a substrate 800 into a layer of negative photoresist thereon, to create optical microstructures 132', for example as was described in connection with FIGS. 13A and 13B. A large number, for example on the order of up to about 1,000 or more, second generation stampers 1420 may be produced from a single master, using conventional techniques. As seen in FIG. 14, the stampers 1420 are negative replicas of the master 1400 with convexities turned into concavities and vice versa. Then, a large number, such as on the order of up to about 1,000 or more, end products 1430, such as microlenses for computer displays or televisions, may be created from each stamper 1420. The end products 1430 are the mirror image of the stampers 1420, so that they correspond to a positive image of the master 1400.

Accordingly, in the example shown in FIG. 14, on the order of up to one million or more end products 1430 may be created from a single master 1400 using only two generations of replication. In contrast, when using a positive photoresist, the master may be a negative of the desired shape, so that the first generation of replicas will be positives. In order to produce positive end products, second and third generations of replication may need to be provided. Unfortunately, third generation replicas may not be sufficiently faithful to the original pattern to be commercially viable. In contrast, a negative photoresist can be used to make a positive copy of the desired shapes in two generations of replication, as shown in FIG. 14, so that up to millions or more of high-quality end products 1430 may be produced from a single master 1400, according to some embodiments of the invention.

Figure 15:
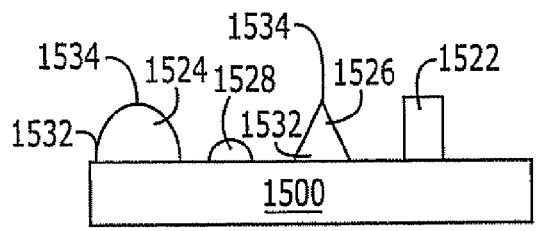
FIGS. 15 and 16 are cross-sectional views of optical microstructures that are fabricated using conventional front-side imaging with positive photoresist.
Figure 16:
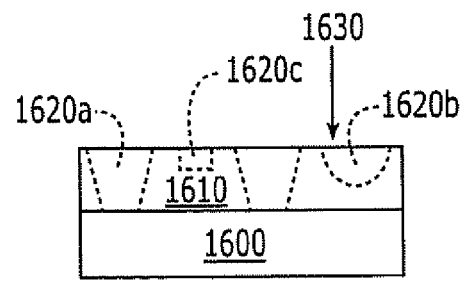

FIGS. 15 and 16 illustrate other potential advantages of back-side imaging combined with negative photoresist according to some embodiments of the present invention. In particular, FIG. 15 illustrates an example of optical microstructures on a substrate 1500. As shown in FIG. 15, it generally may be desirable to form optical microstructures having walls that are orthogonal to the substrate 1500, as shown by microstructure 1522, or lens or prism microstructures 1524 and 1526, respectively, having bases 1532 adjacent the substrate 1500 and vertices or tips, generally referred to herein as "tops", 1534, remote from the substrate 1500, wherein the bases 1532 are wider than the tops 1534. Moreover, it may be desirable to form some microstructures, such as microstructure 1528, that are short relative to other taller microstructures 1522, 1524 and/or 1526.

As shown in FIG. 16, some embodiments of the invention arise from the recognition that it may be difficult to form these shapes using conventional positive photoresist 1610 and conventional photoresist-incident ("front-side") exposure. In particular, as shown in FIG. 16, when using positive photoresist 1610 and front-side exposure 1630 as is conventionally used, for example, in the semiconductor industry, the radiation acts as a "punch" to image the outer surface of the photoresist 1610 opposite the substrate 1600. This relationship tends to form images 1620a, 1620b which are the opposite in shape as those which may be desired for optical microstructures (FIG. 15). Moreover, as also shown in FIG. 16, relatively shallow images 1620c may exist only at the exposed surface of the photoresist layer 1610 and may be washed away during development. See, for example, Paragraphs 56-67 of the above-cited U.S. Published Patent Application 2002/0034014.

Figure 17:
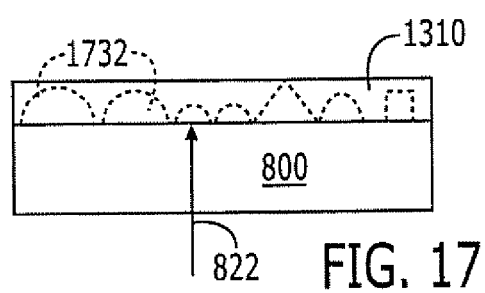
FIGS. 17-19 are cross-sectional views of systems and methods for fabricating optical microstructures according to other embodiments of the present invention.

In sharp contrast, as was shown, for example, in FIGS. 13A and 13B, back-side imaging combined with negative photoresist, according to some embodiments of the invention, can produce optical microstructures 132' that include bases 1302 adjacent the substrate 800 and tops 1304 that are narrower than the bases 1302, remote from the substrate 800. Moreover, as shown in FIG. 17, embodiments of the present invention that image through the substrate 800 and use negative photoresist 1310 can provide a photoresist layer 1310 that is thicker than the desired heights of the optical microstructures 1732, so that the radiation beam may be impinged through the substrate 800 into the negative photoresist layer 1310 to image buried optical microstructures 1732 in the negative photoresist layer 1310, adjacent the substrate 800. As long as the negative photoresist layer 1310 is at least as thick as the thickest optical microstructure 1732 that is desired to be fabricated, relatively thick and relatively thin microstructures may be fabricated in one negative photoresist layer, adjacent the substrate 800, and may not be washed away during the development process.

Figure 18:
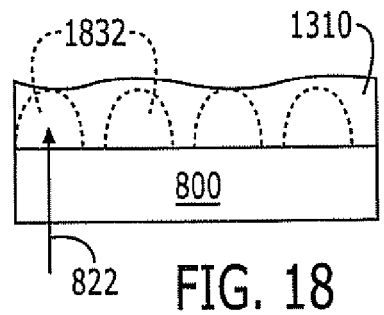

FIG. 18 illustrates other embodiments of the present invention that may use negative photoresist 1310 and imaging by a laser beam 822 through the substrate 800. As shown in FIG. 18, when forming a layer of negative photoresist 1310 over a large substrate 800, the photoresist may have non-uniform thickness. However, as shown in FIG. 18, as long as the minimum thickness of the negative photoresist layer 1310 is thicker than the optical microstructures 1832, then buried optical microstructures 1832 may be imaged in the photoresist layer 1310 of variable thickness, adjacent the substrate 800, that may be independent of the variable thickness of the negative photoresist layer 1310.

Figure 19:
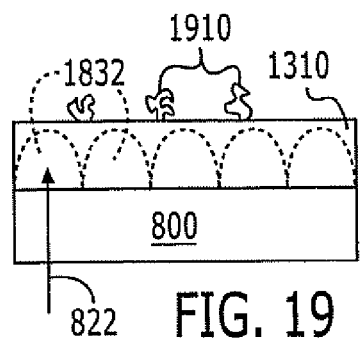

Other potential advantages of the use of back-side exposure and negative photoresist, according to some embodiments of the present invention, are shown in FIG. 19. As shown in FIG. 19, the negative photoresist layer 1310 may include impurities 1910 thereon. When using conventional front-side imaging rather than back-side imaging, these impurities 1910 may interfere with the front-side imaging. However, when using back-side imaging as shown in FIG. 19, the laser beam 822 need not pass through or focus on, the outer surface 1310a of the negative photoresist 1310, remote from the substrate 800. Thus, impurities 1910 need not impact the formation of optical microstructures 1832. Accordingly, imaging may take place in a non-clean room environment in some embodiments of the present invention.

Other potential advantages of the use of negative photoresist may include the fact that its chemistry involves a cross-linking of polymers during the exposure and development processes, which may provide added mechanical, chemical and/or thermal stability to the master during the replication process. In addition, since development may remove the bulk of the negative photoresist layer 1310 from the substrate 800, there can be less internal stress remaining in the developed master. A protective layer also may be provided on the negative photoresist layer, opposite the substrate, as will be described below.

Additional discussion of the use of back-side imaging and/or negative photoresist according to some embodiments of the present invention now will be provided. In particular, as was described above, it may be difficult to create desired shapes for optical microstructures using standard lithographic approaches, particularly when applied to thick films of photoresist, i.e., layers of photoresist that are thicker than about 10 μm. Issues of uniformity of the thickness of the photoresist and quality of the photoresist surface can also interfere with the process. Given its base application in integrated circuit fabrication, photolithography has conventionally been performed on substrates such as silicon or other semiconductors which generally are not transparent to the wavelengths of radiation used in the photolithographic process. Accordingly, front-side exposure is conventionally made from the air or free side of the coating of photoresist, remote from the substrate.

In contrast, some embodiments of the present invention expose photoresist through the substrate. Since some embodiments of the present invention need not be concerned with the electrical properties of the substrate that form the master, material such as plastics that are transparent to the wavelengths of radiation that are being employed, may be used. Thus, the photoresist can be exposed through the substrate. Although back-side exposure is applicable in principle to both positive and negative photoresists, it may be particularly beneficial when using negative photoresist.

When exposed through the substrate, negative photoresist can naturally form shapes with their bases adjacent the substrate. In contrast, front-side exposures generally involve some attenuation of the beam energy as it penetrates through the photoresist film. This attenuation generally provides more exposure on the top of the photoresist than at the base thereof, resulting in undercutting. With back-side exposure, there also may be attenuation, but the attenuation can be in the desired direction, with the base of the structure receiving more exposure than the top.

Using back-side exposure, the height of the feature to be formed also can be rendered independent of the thickness of the photoresist. This may be difficult with front-side exposure, since the exposure may need to proceed all the way through the photoresist, from the outer surface of the photoresist to the base thereof, in order to not be washed away. Accordingly, some embodiments of the present invention can make shapes of varying heights, and the uniformity of the thickness of the photoresist and the quality of the photoresist surface need not play a critical role in determining the quality of the optical microstructures.

Figure 20:
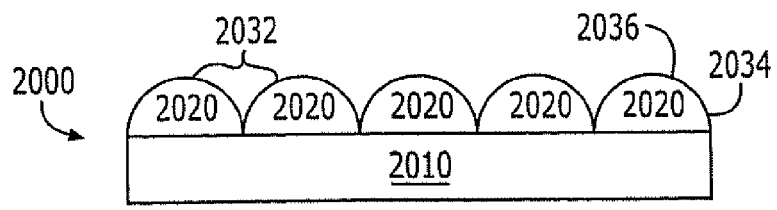
FIG. 20 is a cross-sectional view of optical microstructures according to some embodiments of the present invention.

FIG. 20 illustrates optical microstructures according to some embodiments of the present invention. As shown in FIG. 20, these optical microstructures include a substrate 2010 and a patterned layer of negative photoresist 2020 on the substrate 2010, which is patterned to define therein optical microstructures 2032. In some embodiments, the negative photoresist 2020 is sensitive to radiation at an imaging frequency, and the substrate 2010 is transparent to the imaging frequency.

In some embodiments, the optical microstructures comprise a plurality of optical microstructures 2032 including bases 2034 adjacent the substrate 2010 and tops 2036 remote from the substrate 2010 that are narrower than the bases 2034. In some embodiments, the substrate 2010 is a flexible substrate. In other embodiments, the optical microstructures comprise a plurality of hemispherical sections including bases 2034 adjacent the substrate and tops 2036 remote from the substrate. In some embodiments, the substrate 2010 and the patterned layer of negative photoresist 2020 provide an optical microstructure master 2000.

In some embodiments, the substrate 2010 is cylindrical, ellipsoidal or polygonal in shape. In other embodiments, the substrate 2010 is at least one foot long, one foot wide and/or one square foot in area. In yet other embodiments, the microstructures comprise microlenses. In still other embodiments, the optical microstructures comprise at least about one million optical microstructures 2032. In still other embodiments, the photoresist 2020 may be a negative photoresist. Optical microstructures of FIG. 20 may be fabricated according to any of the methods that were described above in connection with FIGS. 1-14 and/or 17-19.

Figure 21:
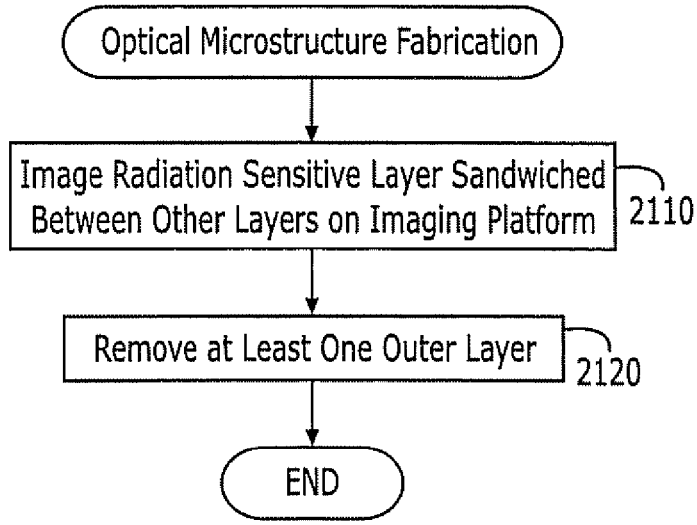
FIGS. 21 and 22 are flowcharts illustrating operations that may be performed to fabricate optical microstructures according to various embodiments of the present invention.

Embodiments of the present invention that can allow mass production of optical microstructure masters, which can be used to master large numbers of optical microstructures, now will be described. In particular, FIG. 21 is a flowchart of operations that may be performed to fabricate optical microstructures. As shown in Block 2110, an optical microstructure master that comprises a radiation sensitive layer sandwiched between a pair of outer layers is imaged on an imaging platform. Any of the imaging platforms and/or techniques that were described in any of the previous figures may be used. Moreover, other embodiments of imaging platforms and/or techniques will be described below. In some embodiments the pair of outer layers comprises a first outer layer adjacent the imaging platform and a second outer layer remote from the imaging platform. It will be understood that, as used herein, the terms "firsts" and "second" are merely used to denote two different outer layers, and that the positions and/or functions of the first and second outer layers may be reversed from those described herein.

Then, referring to Block 2120, at least one of the outer layers is removed. As will be described in detail below, in some embodiments, the first outer layer is removed from the radiation sensitive layer, to thereby separate the radiation sensitive layer and the second outer layer from the imaging platform, while the first outer layer at least temporarily remains on the imaging platform. In other embodiments of the present invention, at least one outer layer is removed from the imaging platform by removing the optical microstructure master, including the radiation sensitive layer sandwiched between the first and second outer layers, from the imaging platform. Subsequent processing may be performed to develop the imaged radiation sensitive layer and to create second generation stampers and third generation end products from the developed radiation sensitive layer.

Figure 22:
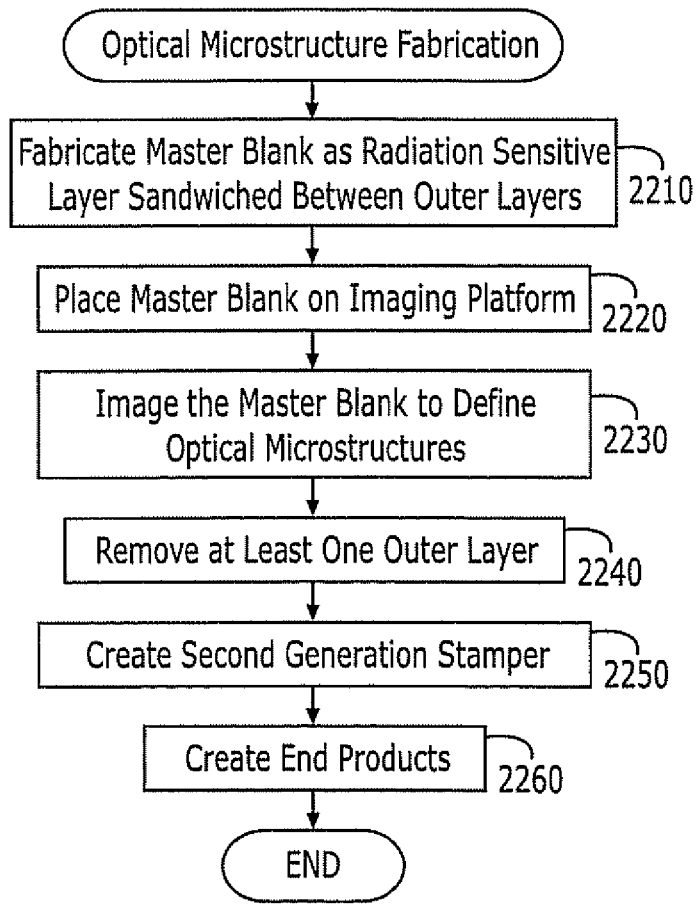

FIG. 22 is a flowchart of operations that may be performed to fabricate optical microstructures according to other embodiments of the present invention. In particular, as shown in FIG. 22, at Block 2210, an optical microstructure master blank or precursor is fabricated by sandwiching a radiation sensitive layer between a pair of outer layers. In some embodiments, a precursor or blank for an optical microstructure master includes a pair of closely spaced apart flexible webs and a radiation sensitive layer that is configured to accept an image of optical microstructures, between the pair of closely spaced apart flexible webs, as will be described in detail below.

Still referring to FIG. 22, at Block 2220, the master blank is placed on an imaging platform. Many examples will be provided below. At Block 2230, the master blank is imaged to define optical microstructures. At Block 2240, at least one outer layer is removed, for example as was described in connection with Block 2120 of FIG. 21. Many other examples will be provided below. At Block 2250, a second generation stamper is created by contacting the optical microstructures in the radiation sensitive layer to a stamper blank. Then, at Block 2260, end products, such as microlenses for computer displays or televisions, are created by contacting the stamper to final product blanks.

Figure 23:
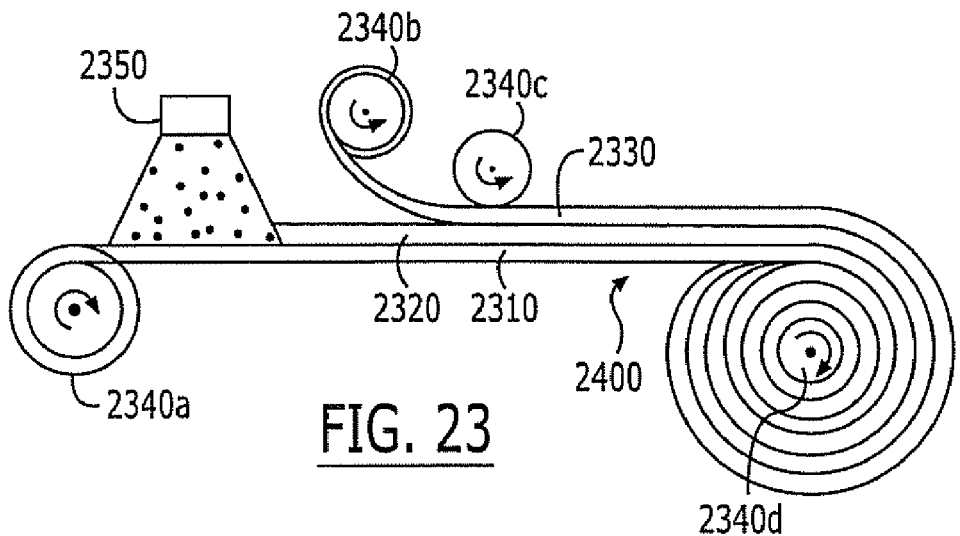
FIG. 23 is a schematic diagram of systems and methods that may be used to fabricate optical microstructure master blanks according to some embodiments of the present invention.

FIG. 23 is a schematic diagram of systems and methods that may be used to fabricate optical microstructure master blanks according to some embodiments of the present invention, which may correspond to Block 2210 of FIG. 22. As shown in FIG. 23, a first roller 2340a or other conventional supply source contains thereon a flexible web of a first outer layer 2310. A radiation sensitive layer coating station 2350 is configured to coat a radiation sensitive layer 2320 on the first outer layer 2310 using one or more conventional coating techniques. As was described above, for example in connection with FIG. 18, some embodiments of the present invention can allow optical microstructure masters to be imaged in the radiation sensitive layer 2320 independent of thickness variations of the radiation sensitive layer 2320.

Still referring to FIG. 23, a second roller 2340b or other conventional supply source contains thereon a web of a second outer layer 2330. A lamination station, which can include a roller 2340c and/or other conventional laminating devices, is used to laminate the second outer layer 2330 to the radiation sensitive layer 2320 opposite the first outer layer 2310, which is then gathered on a take-up roller 2340d or other storage device. Thus, as shown in FIG. 24, a blank or precursor structure 2400 for an optical microstructure master, according to some embodiments of the invention, includes a pair of closely spaced apart flexible webs 2310 and 2330, and a radiation sensitive layer 2320 that is configured to accept an image of optical microstructures, between the pair of closely spaced apart flexible webs 2310 and 2330.

Figure 24:
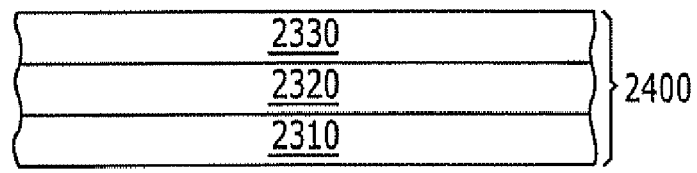
FIG. 24 is a cross-sectional view of an optical microstructure master blank according to some embodiments of the present invention.

Optical microstructure master precursors 2400 of FIG. 24 may be used in any of the embodiments described above in connection with FIGS. 1-22. In some embodiments, the radiation sensitive layer 2320 can embody the layers 110, 810, 810', 810", 1210, 1310, 1610 and/or 2020 that were described above. In some embodiments, the second outer layer 2330 can provide a flexible, optically transparent substrate, which may correspond to the substrate 800, 800', 800", 1200, 1600 and/or 2010 that were described above. The first outer layer 2310 can provide a release layer that may be placed adjacent an imaging platform in any of the preceding figures, to allow release of the optical microstructure master precursor 2400 from an imaging platform after imaging. The first outer layer 2310 may also function as a pellicle, which can protect the radiation sensitive layer 2320 from contaminants prior to, during and/or after imaging, so that fabrication, storage and/or imaging of the optical microstructure master precursors 2400 need not take place in a clean room environment. The first outer layer 2310 also may function as an optically absorbing, reflective or transmissive layer during the imaging process. Combinations of these and/or other properties also may be provided in the first outer layer 2310. It also will be understood that the first outer layer 2310 and/or the second outer layer 2330 can comprise a plurality of sublayers.

Still referring to FIG. 24, in some embodiments of the present invention, the radiation sensitive layer 2320 is a negative photoresist layer, as was described extensively above. In other embodiments of the present invention, the first outer layer 2310 and the second outer layer 2330 are identical. In still other embodiments, the negative photoresist layer 2320 is sensitive to radiation at a predetermined frequency, and the second outer layer 2330 is transparent to radiation at the predetermined frequency. In still other embodiments of the present invention, the second outer layer 2330 is transparent to radiation at the predetermined frequency and the first outer layer 2310 is opaque to radiation at the predetermined frequency. As was also already described, the structure and/or functions of the first and second outer layers may be reversed.

In some embodiments of the present invention, the optical microstructure master blank or precursor 2400 includes a second outer layer 2330 that is transparent to the wavelengths of radiation used in exposure, is flat, relatively free of imperfections (i.e., of optical quality), clear and without haze. It may be desirable for the radiation sensitive layer 2320 to adhere well to the second outer layer 2330, and it may be desirable for the second outer layer 2330 to be relatively impervious to the chemicals and thermal processes that may be involved in developing the radiation sensitive layer. In some embodiments, the second outer layer 2330 comprises plastic, such as polyester, polycarbonate and/or polyethylene. The first outer layer 2310 also may comprise plastic, such as polyester, polycarbonate and/or polyethylene.

Embodiments of the present invention as shown in FIGS. 23 and 24 may be contrasted with conventional mastering approaches for optical microstructures, which generally have been performed on expensive and/or inflexible substrates such as glass, silica or silicon. These masters may not exceed 300 mm in diameter. In contrast, embodiments of the present invention as shown in FIGS. 23 and 24 can fabricate large area master blanks from webs, which may be more than about a foot wide in some embodiments. The master blanks can be set up for exposure, and can permit rapid turnaround of the imaging platform or mastering machine. Thus, embodiments of the present invention as shown in FIGS. 23 and 24 can be used where the imaging platforms may be expensive and/or require long lead time items. The master blanks can be placed on the imaging platform for imaging, and then taken off the imaging platform to free the imaging platform for another master blank, as will be described in detail below.

Figure 25A:
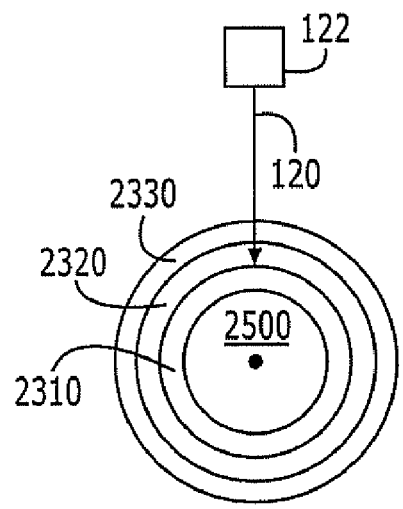

FIGS. 25A-25E are cross-sectional views of systems and methods of fabricating optical microstructures according to some embodiments of the present invention. As shown in FIG. 25A, a flexible optical microstructure master blank or precursor 2400 of FIG. 24 is wrapped around a cylindrical imaging platform 2500, which may correspond to one of the imaging platforms of FIGS. 1-4, 7 and/or 9 that were described above. In some embodiments, imagine can take place through the second outer layer 2330 according to any of the techniques for back-side imaging that were described above, to produce an image of optical microstructures in the radiation sensitive layer 2320. Accordingly, FIG. 25A illustrates some embodiments of Blocks 2110, 2220 and/or 2230.

Figure 25B:
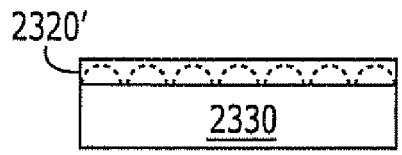
Figure 25C:
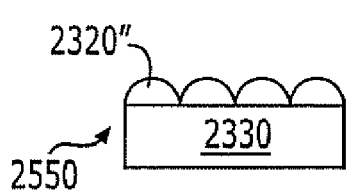

Then, referring to FIG. 25B, in some embodiments, the first outer layer 2310 can act as a release layer, which can permit removal of the second outer layer 2330 and the imaged radiation sensitive layer 2320' from the first outer layer 2310. The imaged radiation sensitive layer 2320' is developed to produce optical microstructures 2320" as shown in FIG. 25C. Thus, FIG. 25C illustrates another embodiment of a completed optical microstructure master 2550, and FIGS. 25B and 25C illustrate embodiments of Blocks 2120 and/or 2240.

Figure 25D:
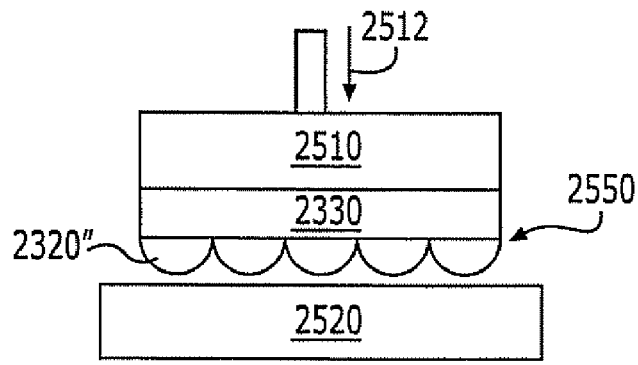
Figure 25E:
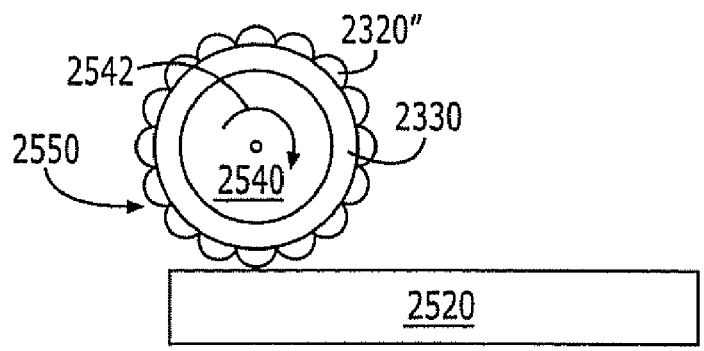

A second generation of optical microstructures, also referred to as a stamper, is created from the master 2550 that contains the optical microstructures 2320" in the developed radiation sensitive layer, by contacting the optical microstructures 2320" to a stamper blank. This may correspond to Block 2250. In particular, as shown in FIG. 25D, contacting to a stamper blank may take place by mounting the master 2550 on a planar stamping platform 2510, and pressing the planar stamping platform 2510 against a stamper blank 2520 in the direction shown by arrow 2512. In other embodiments, as shown in FIG. 25E, the master 2550 is placed on a cylindrical stamping platform 2540, and rolled in the direction of arrow 2542 against a stamper blank 2520, to create a stamper.

FIGS. 26A and 26B illustrate other embodiments of the present invention, which may be formed in operations of Blocks 2120 and/or 2240. In FIG. 26A, the step of removing at least one outer layer is performed by removing the entire imaged master blank 2400 from the imaging platform 2500. Then, in FIG. 26B, the first outer layer 2310 is removed from the imaged radiation sensitive layer 2320', and the imaged radiation sensitive layer 2320' is developed, to provide the master 2550.

FIG. 27 illustrates yet other embodiments that may be formed in operations of Blocks 2110, 2220 and/or 2230, according to other embodiments of the present invention, wherein the optical microstructure master precursor 2400 is imaged on a planar imaging platform 2700, which may correspond to the imaging platform 1000 or 1100 of respective FIG. 10 or 11. After imaging of FIG. 27, removal (Blocks 2120 and/or 2240) may take place as was described in connection with FIG. 25B and/or FIG. 26A. Moreover, stamping operations may take place as was described in connection with FIGS. 25D and/or 25E. Accordingly, imaging may take place on a planar or nonplanar imaging platform, and stamping may take place on a planar or nonplanar stamping platform, which may or may not be the same platform as the imaging platform, according to various embodiments of the present invention.

Additional discussion of FIGS. 21-27, according to some embodiments of the present invention, now will be provided. In particular, an optical microstructure master blank or precursor 2400 may be held on a cylindrical imaging platform, such as platform 2500 of FIG. 25A, or on a planar imaging platform, such as platform 2700 of FIG. 27, using electrostatic charge, vacuum chuck, adhesive tape and/or other conventional techniques which may be depend on the thickness, weight and/or flexibility of the master blank 2400. Moreover, after imaging or exposure in FIGS. 25A and/or 27, the optical microstructure master precursor 2400 undergoes post-exposure development of the radiation sensitive layer, to create a master, such as the master 2550 of FIGS. 25C and/or 26B.

It will be understood by those having skill in the art that removable optical microstructure master precursors 2400 can be used for both front-side and back-side exposures, and with both positive and negative photoresists. However, some embodiments of the present invention use back-side exposure and negative photoresist, as was described extensively above. When using back-side exposure and negative photoresist, the first outer layer 2310 may be removed after imaging. Removal of the first outer layer 2310 may take place on the imaging platform as was described, for example, in FIGS. 25A and 25B, or after removal of the imaged master from the imaging platform as was described in FIGS. 26A and 26B.

Accordingly, embodiments of the present invention that were described above in connection with FIGS. 21-27 can provide for removing of the first outer layer 2310 from the imaged radiation sensitive layer 2320', to thereby remove the imaged radiation sensitive layer 2320' from the imaging platform 2500 or 2700 after imaging has taken place. A stamper may be created from the optical microstructures 2320'' by contacting the optical microstructures 2320'' to a stamper blank 2520. In other embodiments, the first outer layer 2310 is separated from the imaging platform 2500 or 2700 after imaging has taken place. Then, the first outer layer 2310 is separated from the imaged radiation sensitive layer 2320'. A stamper may be created from the optical microstructures 2320'' by contacting the optical microstructures 2320'' to a stamper blank 2520. In some embodiments, the optical microstructures are pressed against a stamper blank (FIG. 25D). In other embodiments, the optical microstructures are rolled against a stamper blank (FIG. 25E).

Removable optical microstructure master blanks as were described in connection with FIGS. 21-27 may be particularly suitable for mass production of masters and stampers according to some embodiments of the present invention. In particular, as shown in FIG. 28, imaging of an optical microstructure master precursor 2400 may take place, while creating stampers from an optical microstructure master 2550 that was previously imaged. Thus, imaging of an optical microstructure master precursor and creating stampers from a previously imaged microstructure master precursor at least partially overlap in time.

Thus, a potentially expensive and/or long lead time optical imaging platform 2500 may be used on an almost continuous basis for imaging, by removing an optical microstructure master precursor from the imaging platform 2500, after imaging. However, in other embodiments of the present invention, the imaging platform also may be used as a stamping platform, by not removing the imaged optical microstructure master precursor from the imaging platform. It will be understood that in FIG. 28, cylindrical and/or planar imaging platforms may be used, and pressing and/or rolling of the master against the stamper blank may be used, as was described in connection with FIGS. 25-27.

Mastering on removable substrates can permit the same machine and/or platform to be used to form masters with a number of different radiation sensitive layers, coated on different substrates of varying thickness. The use of negative photoresist and exposure through the substrate can permit use of removable masters according to some embodiments of the present invention, since the surface of the photoresist that is attached to the imaging platform can be removed during developing and, thus, need not be involved in the final production of the optical elements. Similarly, it is possible to employ simple, rapid and/or relatively inexpensive techniques of coating photoresist onto the substrate when using negative photoresists and back-side exposure, according to some embodiments of the present invention.

Accordingly, some embodiments of the present invention can provide a master for replicating large numbers of optical microstructures that are formed by multiple exposures through a transparent, removable substrate, into negative photoresist on a removable substrate. This can provide commercially viable mastering systems, methods and products for large numbers of optical microstructures. In some embodiments of the present invention, masters of at least about one foot long, about one foot wide and/or about one foot square, containing up to about one million or more microstructures of about 100 m or smaller in size, can be mastered in about 8 to 15 hours. Optical elements with arbitrary shapes can be formed by varying exposure from point to point in the master. The spacing of the elements in the master can be varied from widely separated to overlapping. The master can be created on a removable substrate, so that the mastering platform can be reconfigured for further mastering work.

Finally, it will be understood that embodiments of the present invention have been described herein relative to the fabrication of optical microstructures, which may include microlenses, optical gratings, microreflectors and/or other optically-absorbing transmissive and/or reflective structures, the individual sizes of which are on the order of microns, for example on the order of about 5 µm to about 1000 µm, in size. However, it will be understood that other embodiments of the present invention may be used to fabricate mechanical microstructures such as pneumatic, hydraulic and/or microelectromechanical system (MEMS) microstructures, which may be used for micro-fluidics, micro-pneumatics and/or micromechanical systems, the individual sizes of which are on the order of microns, for example on the order of about 5 µm to about 1000 µm, in size.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a microlens array comprising:
imaging a microlens array master blank that comprises a radiation sensitive layer sandwiched between a pair of outer layers, on an imaging platform, by scanning a radiation beam through one of the outer layers and across at least a portion of the radiation sensitive layer at varying amplitude, to define the microlens array in the radiation sensitive layer; and
removing at least one of the outer layers, wherein the imaging platform comprises a cylindrical platform and wherein imaging comprises rotating the cylindrical platform about an axis thereof while simultaneously rastering the radiation beam through one of the outer layers and across at least a portion of the radiation sensitive layer.

2. A method according to claim 1 wherein imaging is preceded by:
placing the radiation sensitive layer sandwiched between a pair of outer layers on the imaging platform.

3. A method according to claim 1 further comprising simultaneously translating the cylindrical platform and/or radiation beam axially relative to one another.

4. A method according to claim 3 wherein the varying amplitude comprises a continuously varying amplitude.

5. A method according to claim 1 wherein the radiation sensitive layer is at least about one square foot in area.

6. A method according to claim 1 wherein imaging is performed continuously on the radiation sensitive layer for at least about 1 hour.

7. A method according to claim 1 wherein imaging is performed continuously on the radiation sensitive layer for at least about 1 hour to fabricate at least about one million microlenses.

8. A method according to claim 1 further comprising:
developing the microlens array that was defined in the radiation sensitive layer to provide a microlens array master.

9. A method according to claim 1 wherein the pair of outer layers are cylindrical, ellipsoidal or polygonal in shape.

10. A method according to claim 1 wherein the pair of outer layers comprise a first outer layer adjacent the imaging platform and a second outer layer remote from the imaging platform, the imaging comprising:
impinging the radiation beam through the second outer layer into the radiation sensitive layer to define the microlens array in the radiation sensitive layer.

11. A method according to claim 1 wherein the radiation sensitive layer is a negative photoresist layer such that portions of the negative photoresist layer that are exposed to the radiation beam remain after development.

12. A method according to claim 1 wherein the pair of outer layers are flexible.

13. A method of fabricating a microlens array master comprising:
placing on a cylindrical platform, a microlens array master blank that comprises a first outer layer, a negative photoresist layer on the first outer layer and a second outer layer on the negative photoresist layer, such that the first outer layer is adjacent the cylindrical platform and the second outer layer is remote from the cylindrical platform;
impinging a laser beam through the second outer layer into the negative photoresist layer while simultaneously rotating the cylindrical platform about an axis thereof and while simultaneously axially rastering the laser beam across at least a portion of the negative photoresist layer to image the microlens array in the negative photoresist layer;
separating the first outer layer from the cylindrical platform;
separating the first outer layer from the negative photoresist layer; and
developing the microlens array that was imaged in the negative photoresist layer.

14. A method according to claim 13 further comprising simultaneously translating the cylindrical platform and/or laser beam axially relative to one another.

15. A method according to claim 14 further comprising simultaneously continuously varying amplitude of the laser beam.

16. A method according to claim 13 wherein the microlens array master blank is at least about one square foot in area.

17. A method according to claim 16 wherein impinging is performed continuously on the microlens array master blank for at least about 1 hour.

18. A method according to claim 17 wherein impinging is performed continuously on the microlens master blank for at least about 1 hour to fabricate at least about one million microlenses.

19. A method according to claim 13 wherein the first and second outer layers are flexible.

* * * * *